(12) United States Patent
Lee et al.

(10) Patent No.: US 12,165,869 B2
(45) Date of Patent: Dec. 10, 2024

(54) TRANSISTORS COMPRISING A VERTICAL STACK OF ELONGATED SEMICONDUCTOR FEATURES

(71) Applicant: Taiwan Semiconductor Manufacturing Company, Ltd., Hsin-Chu (TW)

(72) Inventors: Tung Ying Lee, Hsinchu (TW); Shao-Ming Yu, Zhubei (TW); Wei-Sheng Yun, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 770 days.

(21) Appl. No.: 16/730,368

(22) Filed: Dec. 30, 2019

(65) Prior Publication Data

US 2020/0258740 A1    Aug. 13, 2020

Related U.S. Application Data

(60) Continuation-in-part of application No. 16/033,401, filed on Jul. 12, 2018, now Pat. No. 10,770,290, (Continued)

(51) Int. Cl.
*H01L 21/02* (2006.01)
*H01L 21/283* (2006.01)
(Continued)

(52) U.S. Cl.
CPC ...... *H01L 21/02603* (2013.01); *H01L 21/283* (2013.01); *H01L 29/0649* (2013.01);
(Continued)

(58) Field of Classification Search
CPC ............ H01L 21/02603; H01L 21/283; H01L 29/0649; H01L 29/0673; H01L 29/1079;
(Continued)

(56) References Cited

U.S. PATENT DOCUMENTS 7,425,740 B2    9/2008    Liu et al.
8,048,723 B2    11/2011   Chang et al.
(Continued)

OTHER PUBLICATIONS

Liaw, Jhon Jhy, "Inner Spacers for Gate-All-Around Semiconductor Devices," U.S. Appl. No. 16/525,876, filed Jul. 30, 2019, 41 pages.

*Primary Examiner* — Khaja Ahmad
(74) *Attorney, Agent, or Firm* — HAYNES AND BOONE, LLP

(57) ABSTRACT

A semiconductor device includes a substrate, a first semiconductor stack including elongated semiconductor features isolated from each other and overlaid in a direction perpendicular to a top surface of the substrate, and a second semiconductor stack including elongated semiconductor features isolated from each other and overlaid in the direction perpendicular to the top surface of the substrate. The second semiconductor stack has different geometric characteristics than the first semiconductor stack. A top surface of the first semiconductor stack is coplanar with a top surface of the second semiconductor stack.

20 Claims, 16 Drawing Sheets

Related U.S. Application Data which is a division of application No. 14/942,546, filed on Nov. 16, 2015, now Pat. No. 10,032,627.

(51) Int. Cl.

| | |
|---|---|
| *H01L 29/06* | (2006.01) |
| *H01L 29/10* | (2006.01) |
| *H01L 29/423* | (2006.01) |
| *H01L 29/66* | (2006.01) |
| *H01L 29/775* | (2006.01) |
| *H01L 29/78* | (2006.01) |
| *H01L 29/786* | (2006.01) |

(52) U.S. Cl.
CPC ...... *H01L 29/0673* (2013.01); *H01L 29/1079* (2013.01); *H01L 29/42392* (2013.01); *H01L 29/66439* (2013.01); *H01L 29/66795* (2013.01); *H01L 29/775* (2013.01); *H01L 29/785* (2013.01); *H01L 29/78696* (2013.01)

(58) Field of Classification Search
CPC ......... H01L 29/42392; H01L 29/66439; H01L 29/66795; H01L 29/775; H01L 29/785; H01L 29/78696
See application file for complete search history.

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2007/0048938 A1* | 3/2007 | Yun ........ H01L 29/785 438/257 |
| 2011/0031473 A1 | 2/2011 | Chang et al. |
| 2011/0070734 A1* | 3/2011 | Saracco ........ H01L 29/775 438/689 |
| 2012/0007052 A1 | 1/2012 | Hobbs et al. |
| 2013/0161756 A1* | 6/2013 | Glass ........ H01L 29/42392 257/E21.632 |
| 2013/0270512 A1* | 10/2013 | Radosavljevic ...... H01L 29/775 438/212 |
| 2013/0285153 A1 | 10/2013 | Lee et al. |
| 2014/0091360 A1* | 4/2014 | Pillarisetty ........ H01L 21/845 257/190 |
| 2014/0151639 A1* | 6/2014 | Chang ........ H01L 29/0673 257/27 |
| 2014/0183600 A1 | 7/2014 | Huang et al. |
| 2014/0210013 A1* | 7/2014 | Kim ........ H01L 21/823807 257/369 |
| 2014/0264590 A1 | 9/2014 | Yu et al. |
| 2014/0264592 A1 | 9/2014 | Oxland et al. |
| 2015/0034899 A1 | 2/2015 | Ching et al. |
| 2015/0041899 A1* | 2/2015 | Yang ........ H01L 21/823821 257/351 |
| 2015/0069328 A1* | 3/2015 | Leobandung ........ B82Y 10/00 438/151 |
| 2015/0108573 A1 | 4/2015 | Liu et al. |
| 2015/0194489 A1 | 7/2015 | Barraud et al. |
| 2015/0243733 A1* | 8/2015 | Yang ........ H01L 29/775 257/401 |
| 2015/0370947 A1* | 12/2015 | Moroz ........ H10B 10/12 716/119 |
| 2016/0293699 A1 | 10/2016 | Leobandung |
| 2016/0372474 A1* | 12/2016 | Yang ........ H01L 27/0924 |
| 2017/0104060 A1 | 4/2017 | Balakrishnan et al. |
| 2017/0256609 A1* | 9/2017 | Bhuwalka ........ H01L 29/78696 |
| 2018/0323065 A1 | 11/2018 | Lee et al. |

* cited by examiner

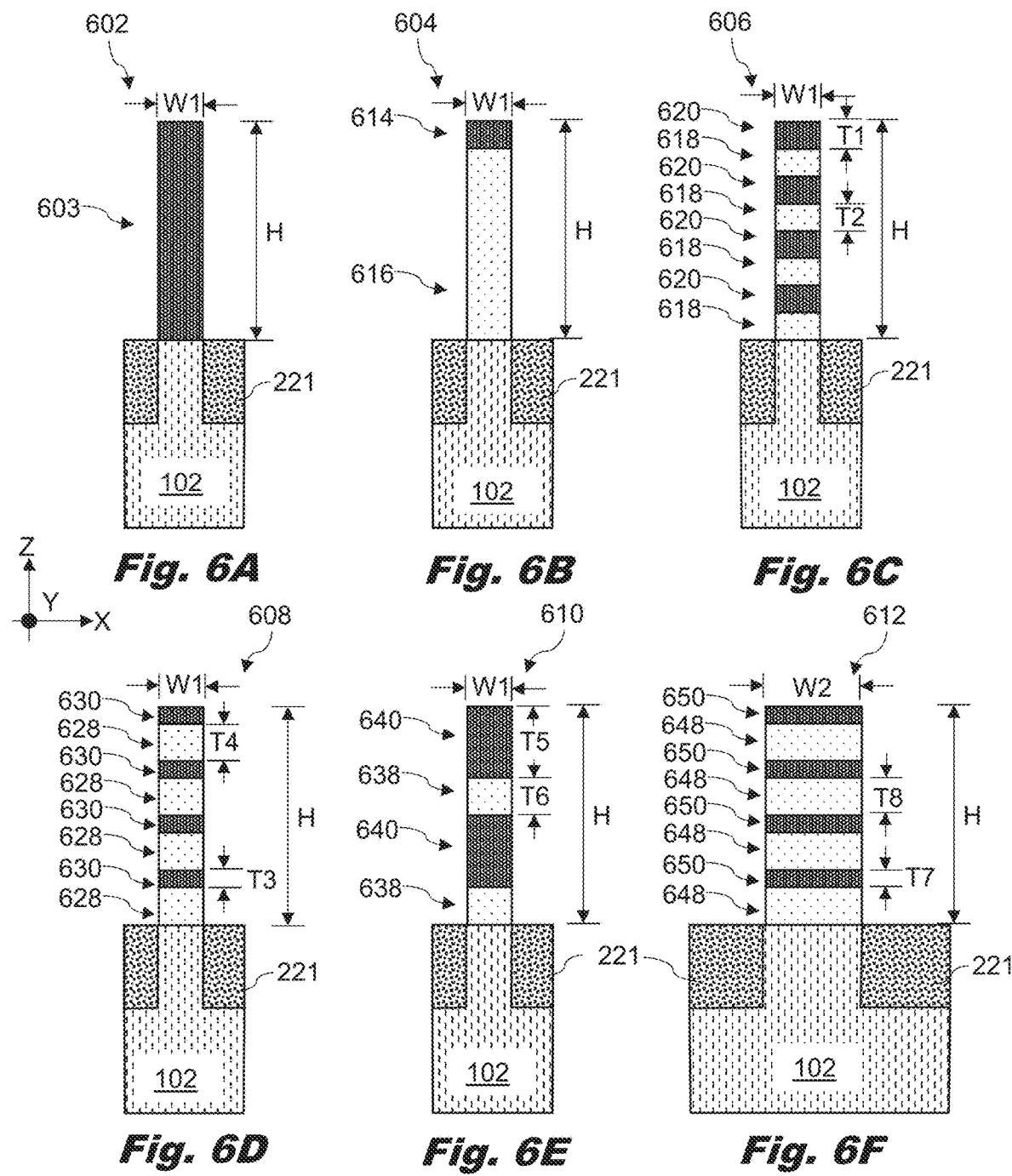

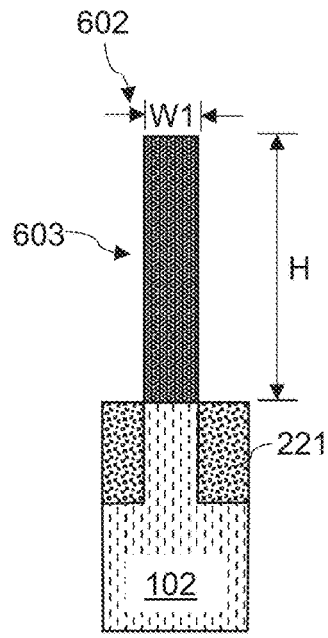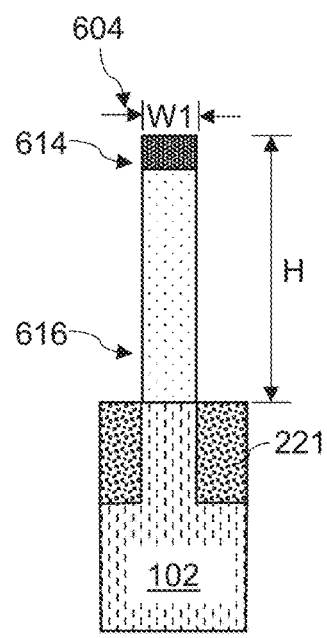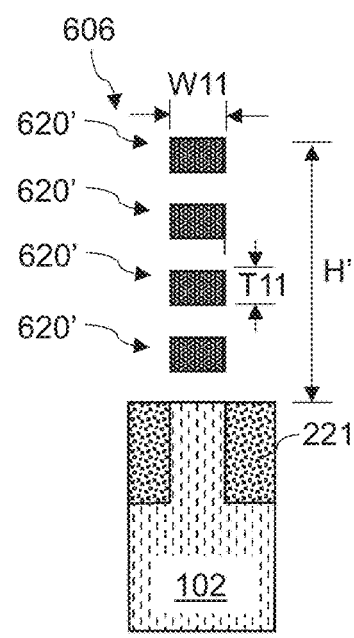
*Fig. 7A*  *Fig. 7B*  *Fig. 7C*
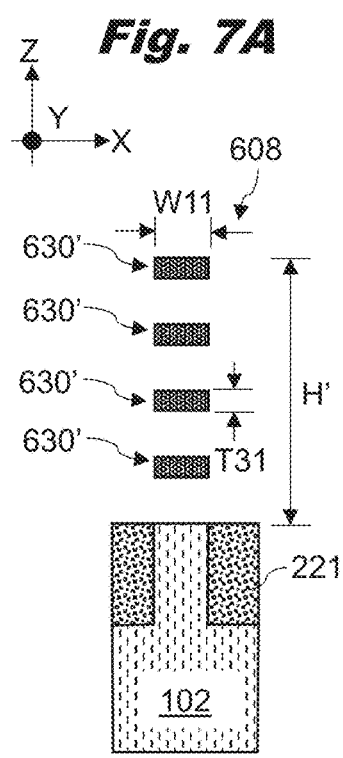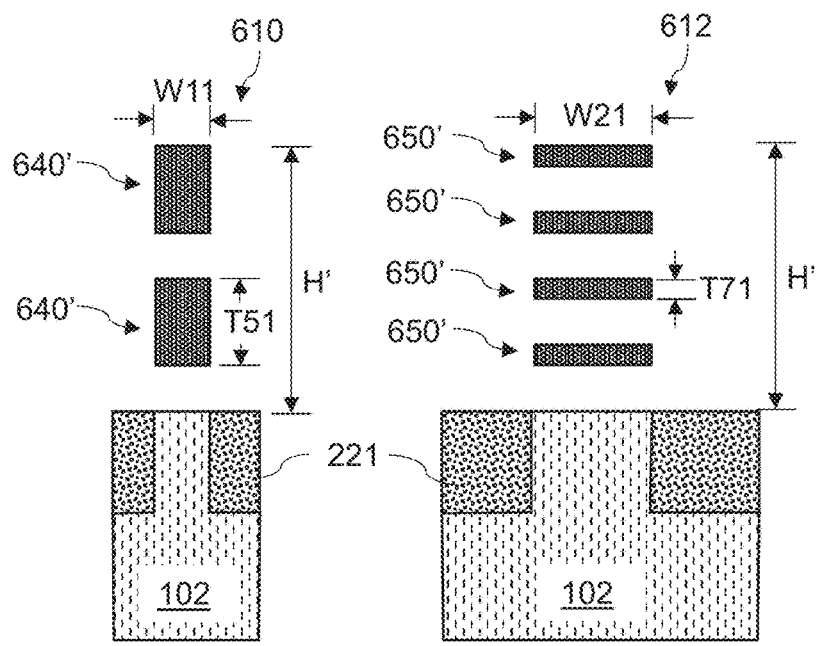
*Fig. 7D*  *Fig. 7E*  *Fig. 7F*

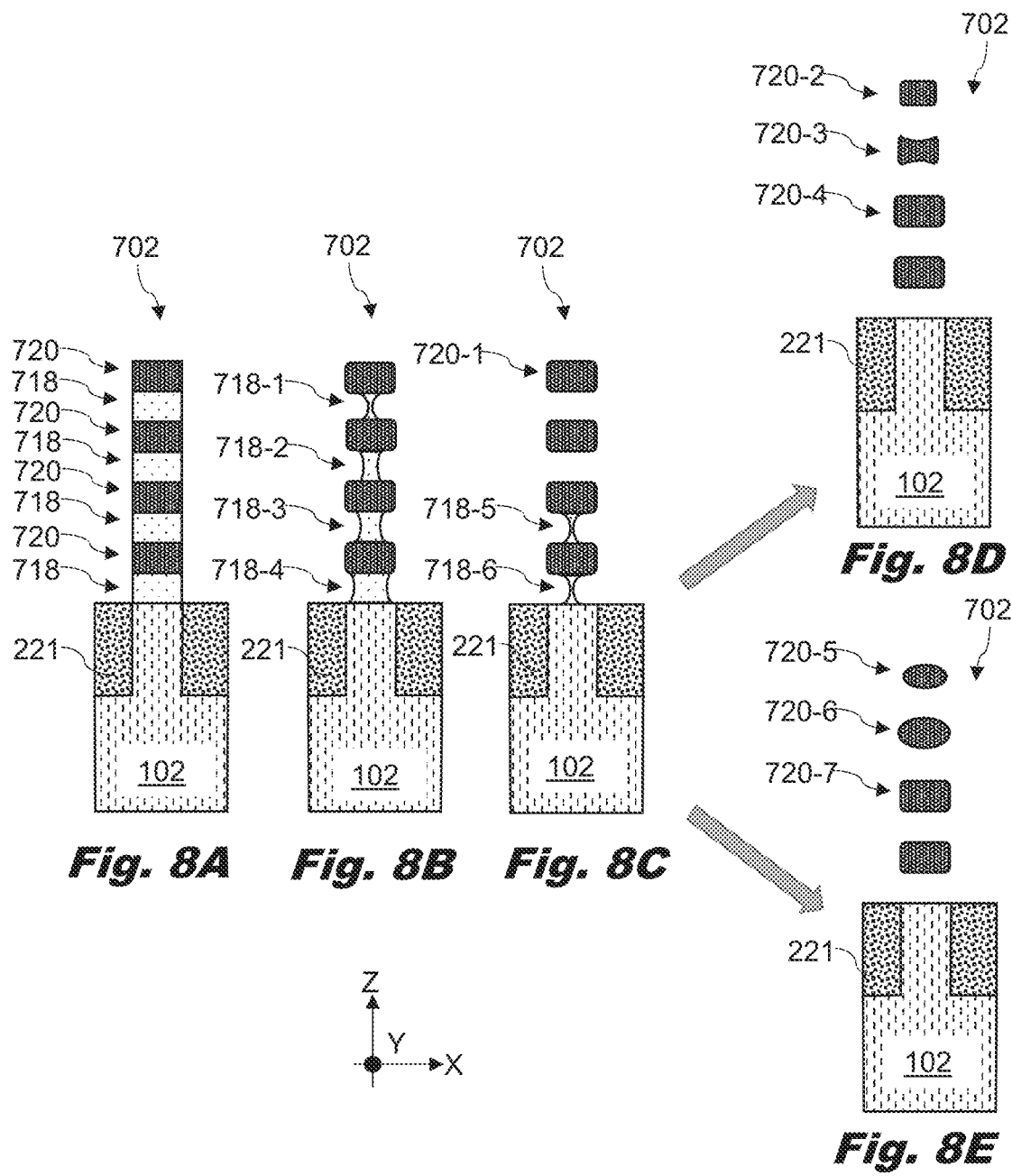

TRANSISTORS COMPRISING A VERTICAL STACK OF ELONGATED SEMICONDUCTOR FEATURES

PRIORITY

The present application is a continuation-in-part of U.S. patent application Ser. No. 16/033,401, filed Jul. 12, 2018, which is a divisional of U.S. patent application Ser. No. 14/942,546, filed Nov. 16, 2015, each of which is herein incorporated by reference in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One type of transistor that helps enable such scaling down is a stacked nanowire transistor. In a stacked nanowire transistor, the channel is made of one or more elongated semiconductor features, each of which is entirely or partially surrounded by the gate structure. Such elongated semiconductor features may also be referred to as nanowires. The nanowires for a single transistor may be vertically stacked.

Various transistors within an integrated circuit serve different functions. For example, some transistors are designed for input/output operations. Some transistors are designed for core processing operations. Some transistors are designed for memory storage operations. While it is desirable that such different transistors have different functions to better serve their purposes, it can be difficult to manufacture multiple stacked nanowire transistors in a single circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6F are diagrams showing active regions of finFETs and stacked nanowire transistors having various characteristics, according to one example of principles described herein.

FIG. 7A-7F are diagrams showing active regions in FIGS. 6A-6F after further processes, according to one example of principles described herein.

FIGS. 8A-8E are diagrams illustrating release of nanostructures in a stacked nanowire transistor, according to examples of principles described herein.

DETAILED DESCRIPTION

Figure 1A:
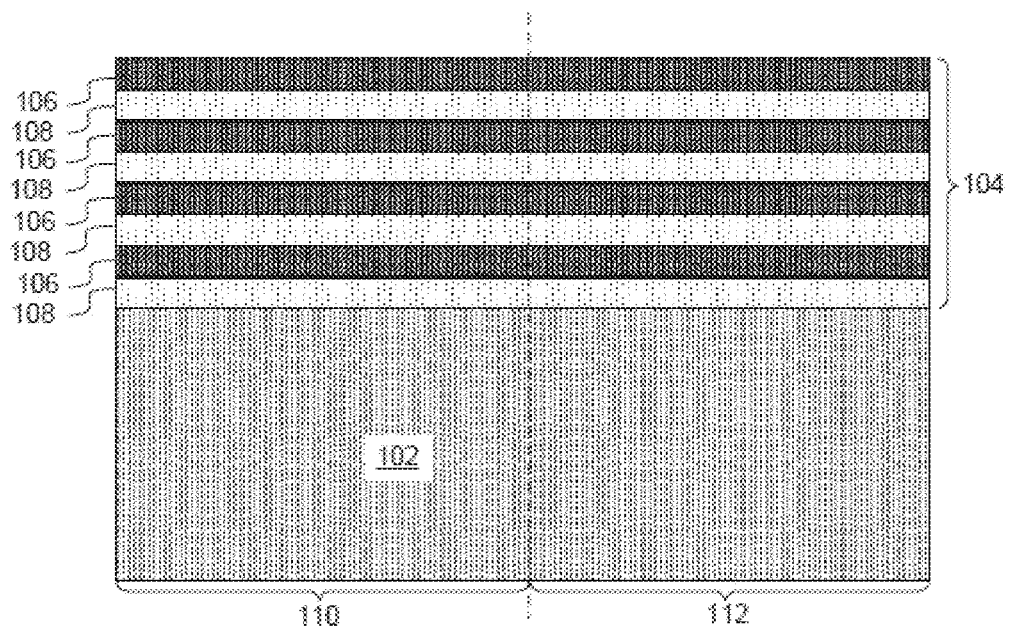
FIGS. 1A, 1B, 1C, 1D, 1E, 1F, 1G, 1H, 1I, and 1J are diagrams showing an illustrative process for forming stacked nanowire transistors having various characteristics, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, various transistors within an integrated circuit serve different functions. While it is desirable that such different transistors have different functions to better serve their purposes, it can be difficult to manufacture multiple stacked nanowire transistors in a single circuit. According to principles described herein, stacked nanowire transistors may be fabricated using techniques that allow for transistors with different characteristics. Thus, transistors can be customized for various purposes within the integrated circuit.

FIGS. 1A, 1B, 1C, 1D, 1E, 1F, 1G, 1H, 1I, and 1J are diagrams showing an illustrative process for forming stacked nanowire transistors having various characteristics. FIG. 1A illustrates a semiconductor stack 104 formed onto a semiconductor substrate 102. The semiconductor stack 104 includes a first plurality of semiconductor layers 106 and a second plurality of semiconductor layers 108. The semiconductor stack 104 alternates between the first plurality semiconductor layers 106 and the second plurality of semiconductor layers 108.

The semiconductor substrate 102 may be a semiconductor wafer used for semiconductor fabrication processes. In one example, the semiconductor substrate 102 may be made of silicon. Other semiconductor materials may be used as well. In the present example, two different regions 110, 112 of the semiconductor wafer are shown. These regions 110, 112 may or may not be adjacent to each other. As will be explained in further detail below, a first type of stacked nanowire transistor will be formed in the first region 110 and a second type of stacked nanowire transistor will be formed in the second region 112. These two different stacked nanowire transistors will have varying characteristics.

Each of the plurality of semiconductor layers 106, 108 may be grown through use of an epitaxial process. In an epitaxial process, a crystalline material is grown onto a crystalline substrate. Here, to form the first of the second plurality of semiconductor layers 108, the crystalline substrate is the semiconductor substrate 102 and the crystalline material to be formed on that substrate is the first of semiconductor layers 108. Then, to form the first of the semiconductor layers 106, the first semiconductor layer 108 acts as the crystalline substrate on which the first of semiconductor layers 106 is formed.

In one example, the first plurality of semiconductor layers 106 may be made of silicon. The second plurality of semiconductor layers 108 may be made of silicon germanium. As will be described in further detail below, the two different materials used for the first plurality of semiconductor layers 106 and the second plurality of semiconductor layers 108 are selected so that they may be selectively etched. Because the second plurality of semiconductor layers 108 will eventually be removed, it is desirable to have an etching process that will remove the second plurality of semiconductor layers 108 while leaving the first plurality of semiconductor layers 106 substantially intact. Other semiconductor materials may be used as well. For example, either the first plurality of semiconductor layers 106 or the second plurality of semiconductor layers 108 may be made of one Germanium (Ge), silicon germanium (SiGe), germanium tin (GeSn), silicon germanium tin (SiGeSn), or a III-V semiconductor.

Figure 1B:
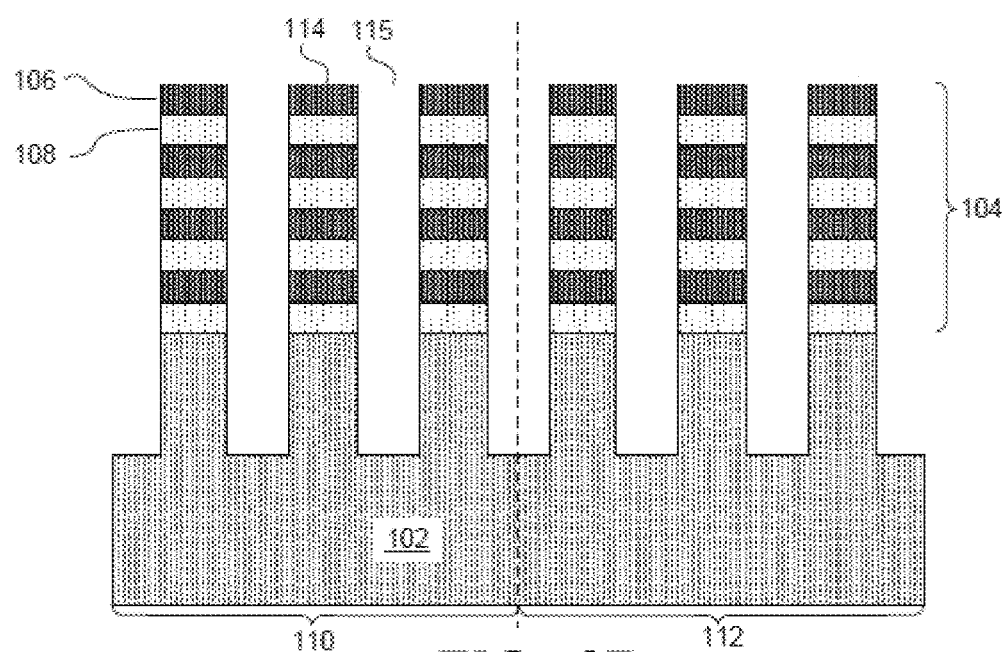

FIG. 1B illustrates a patterning process by which the semiconductor stack 104 is patterned into a plurality of semiconductor stack features 114. The patterning process may be performed using various lithographic techniques. For example, a photoresist layer may be applied to the top of the semiconductor stack 104. The photoresist layer may then be exposed to a light source through a photomask. The photoresist layer may then be developed to expose some regions of the semiconductor stack 104 while covering other regions of the semiconductor stack 104. An etching process may then be applied such that the exposed regions of the semiconductor stack 104 are removed. In one example, the etching process may be an anisotropic etching process such as a dry etching process. The etching process may be designed to form trenches 115 to a desired depth. In the present example, the desired depth extends into the semiconductor substrate 102.

Figure 1C:
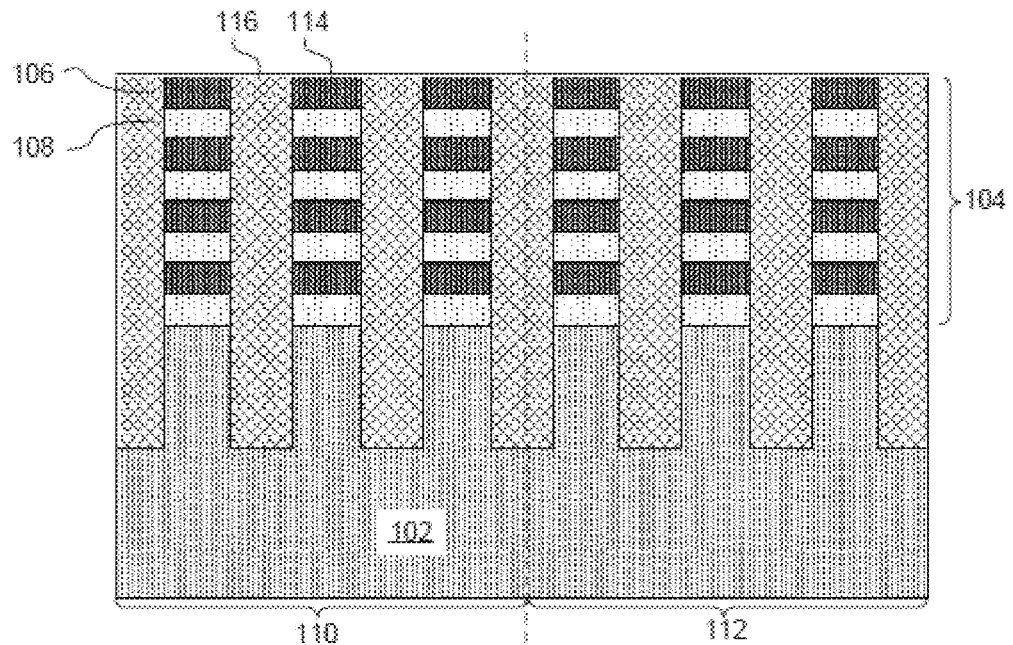

FIG. 1C illustrates the formation of isolation features 116 within the trenches 115 formed by the patterning process. In some examples, the isolation features 116 may be made of a dielectric material. The isolation features 116 may be formed by depositing the isolation feature material into the trenches 115 and then performing a planarizing process such as a chemical mechanical polishing (CMP) process to expose the top surfaces of the semiconductor stack features 114. In some examples, before forming the isolation features 116, an oxide deposition process may be applied to create a liner (not shown) on surfaces of the semiconductor stack features 114 as well as the exposed portions of the semiconductor substrate 102. An annealing process may then be applied to the liner. In some examples, the hard mask (which may include an oxide layer and a silicon nitride layer) used to pattern the semiconductor stack 104 may act as a CMP stop layer. Thus, after the isolation features 116 are formed, there may be hard mask portions remaining over the stack features 114. Various etching processes, such as wet etching, may be used to remove such hard mask portions.

Figure 1D:
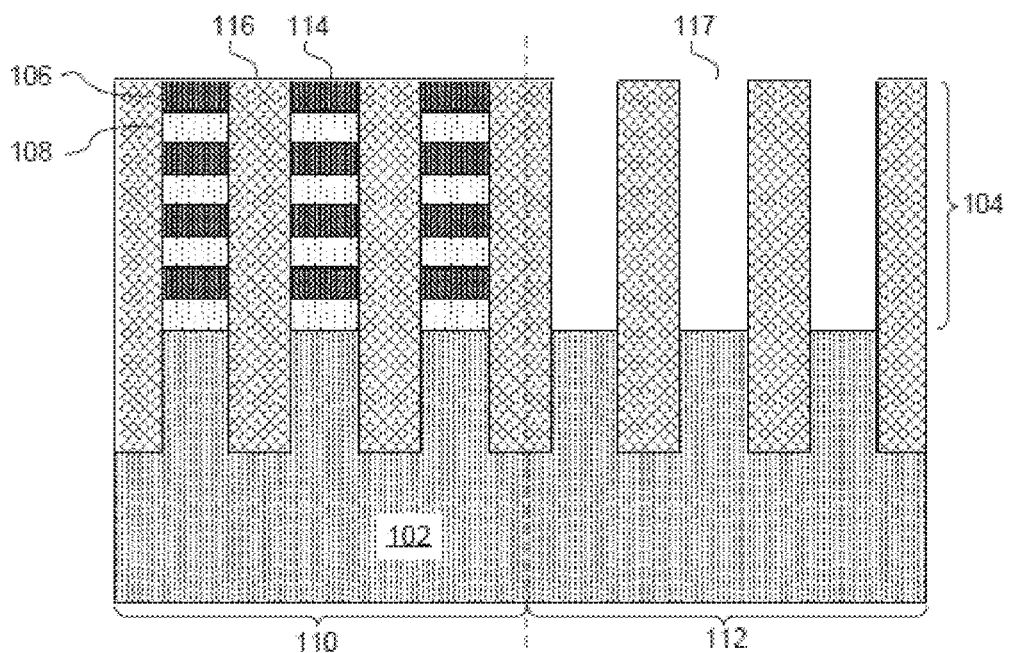

FIG. 1D illustrates the removal of the semiconductor stack features 114 within the second region 112, which leaves trenches 117 between the isolation features 116 within the second region 112. The semiconductor stack features 114 within the first region 110 remain. In one example, the semiconductor stack features 114 within the second region 112 are removed using an etching process. The etching process may be designed to selectively remove the semiconductor stack features 114 while leaving the isolation features 116 substantially intact. Such an etching process may be a wet etching process or a dry etching process. To protect the semiconductor stack features 114 within the first region 110 during such a removal process, a photoresist layer and/or a hard mask layer (not shown) may be formed over the first region 110.

Figure 1E:
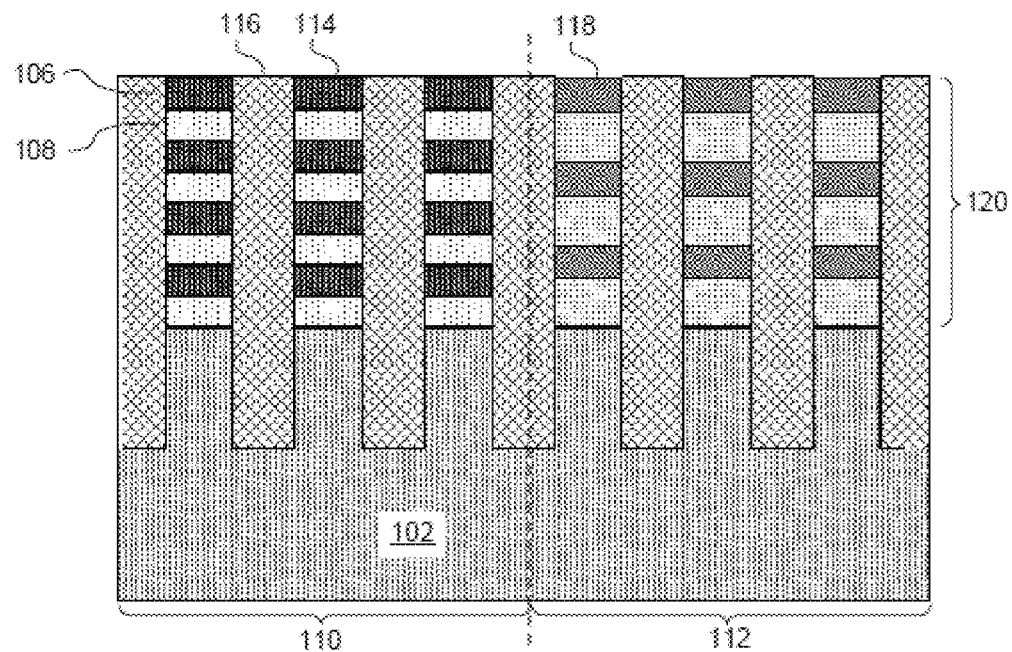

FIG. 1E is a diagram showing replacement of the semiconductor stack features with a second semiconductor stack 120. Formation of the second semiconductor stack 120 results in semiconductor stack features 118 being formed between the isolation features within the trenches 117. The second semiconductor stack 120 may be formed in a manner similar to the first semiconductor stack 104. Specifically, the second semiconductor stack 120 may be formed using an epitaxial growth process. Like the first semiconductor stack 104, the second semiconductor stack 120 may also alternate between two different types of semiconductor materials. The second semiconductor stack 120, however, varies in characteristics from the first semiconductor stack 104. In the present example, the thickness of each of the semiconductor layers within the semiconductor stack 120 is different than the thickness of semiconductor layers of the first semiconductor stack 104. Additionally, the number of each type of layer in the second semiconductor stack 120 is different than the number of each type of layer in the first semiconductor stack 104. Other variations may be present as well. After the second semiconductor stack 120 has been formed, a CMP process may be used to planarize the top surface of the wafer so that the top surfaces of the semiconductor stack features 118 are coplanar with the top surfaces of the isolation features 116. Additionally, the top surfaces of the semiconductor stack features 114 are essentially coplanar with the top surfaces of semiconductor stack features 118.

The different characteristics of the second semiconductor stack 120 can be designed for specific types of transistors. As described above, an integrated circuit typically includes transistors for different functions. Some functions, such as input/output may benefit from a thicker channel. As will be described in further detail below, one of the two types of semiconductor material within each of the semiconductor stack features 114, 118 will be removed. The remaining type of semiconductor material will be used as a channel.

Figure 1F:
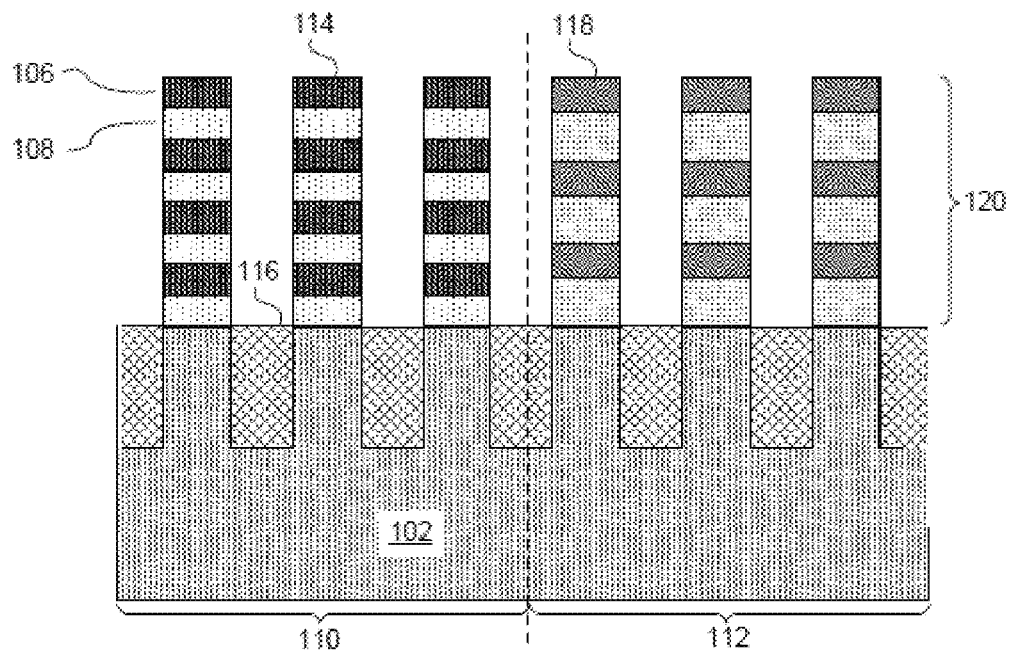

FIG. 1F is a diagram showing a removal process to remove a portion of the isolation features 116. The isolation features 116 may be removed at portions where gate devices intended to be formed. The present cross-section shows the region where the gate is to be formed. In the present example, isolation features are etched in a manner such that the top surfaces of the isolation features 116 are coplanar with the top-most surfaces of the semiconductor substrate 102. In some examples, top surfaces of the isolation features 116 are lower than the top-most surfaces of the semiconductor substrate 102.

The semiconductor stack features 114, 118 are elongated fin-like structures that run perpendicular to the cross-section shown. In the present example, the first plurality of semiconductor layers 106 will form elongated semiconductor features (i.e, nanowires) that are positioned between source and drain regions. The source and drain regions (not shown) may be formed after the removal process shown in FIG. 1F. For example, portions of the semiconductor stack features 114, 118 may be removed and then replaced with a single semiconductor structure that is doped in-situ so as to form a source or drain region.

Figure 1G:
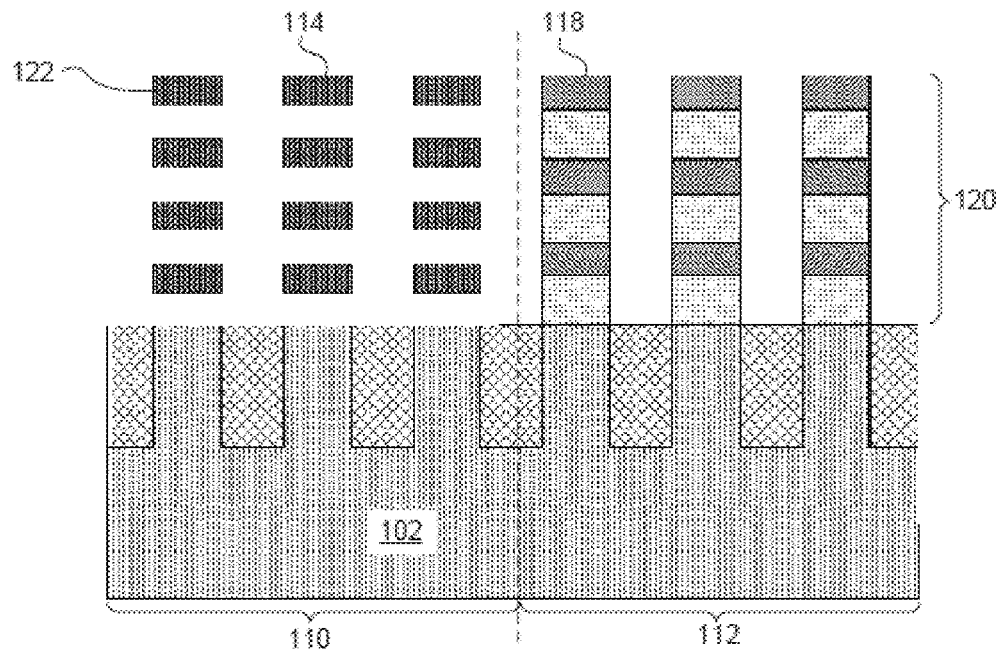
Figure 1H:
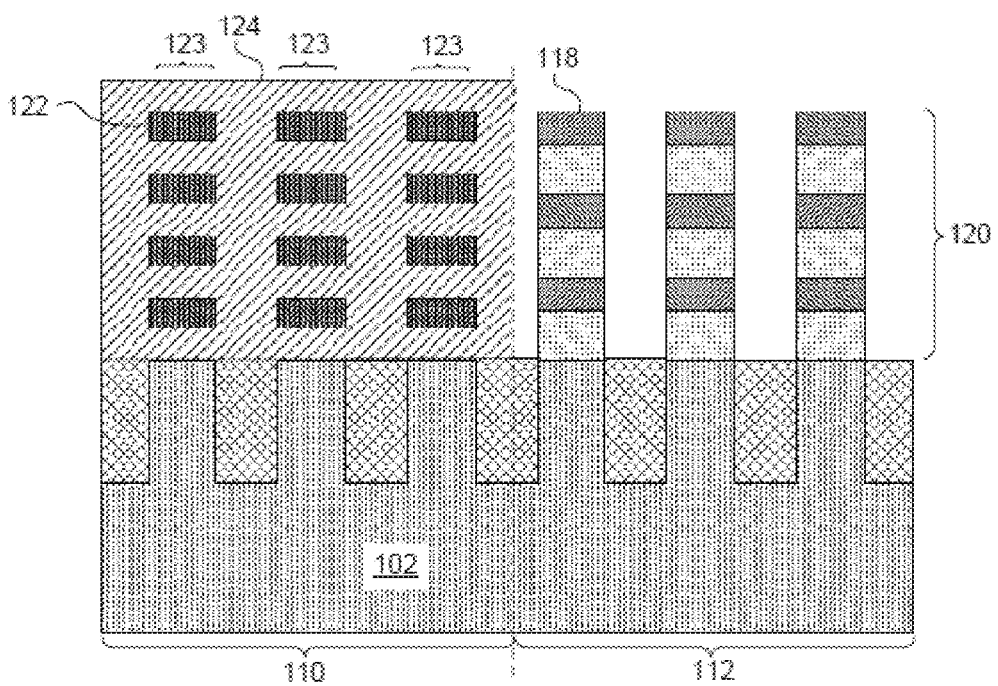

FIGS. 1G and 1H illustrate formation of a gate device for transistors within the first region. FIG. 1G illustrates removal of one of the types of semiconductor material of the first semiconductor stack features 114. Specifically, the material forming the second plurality of semiconductor layers 108 is removed. Such material may be removed using an isotropic etching process such as a wet etching process. Removal of such material leaves a number of elongated semiconductor features 122 suspended between the source and drain regions (not shown).

In some examples, after the elongated semiconductor features 122 have been exposed, an additional epitaxial growth process may be applied to change the size and/or shape of the elongated semiconductor features 122. For example, it may be desired to slightly increase the width and/or thickness of the cross-section of the elongated semiconductor features 122. The epitaxial growth process may also be designed to change the cross-sectional shape of the elongated semiconductor features 122. For example, the cross-sectional shape of the elongated semiconductor features 122 may be rectangular, square, circular, elliptical, diamond, or other shape. In some cases, an isotropic etching process may be used to reduce the size of the exposed elongated semiconductor features 122. Such epitaxial growth or etching processes may be used to tune the dimensions of the elongated semiconductor features 122 as desired.

FIG. 1H illustrates formation of a gate structure 124 within the first region 110. In the present example, the gate structure 124 wraps around each side of the elongated semiconductor features 122. The gate structure 124 also electrically connects the gate devices for a number of stacked nanowire transistors 123 formed within the first region 110.

In some examples, the elongated semiconductor features 122 may undergo various treatment and cleaning processes before the gate structure 124 is formed. For example, a thermal treatment may be applied to the elongated semiconductor features 122 with a temperature within a range of about 650-1000 degrees Celsius. A cleaning process may be used to remove any native oxygen.

The gate structure 124 may include a number of materials. In some examples, the gate structure may include an interfacial layer (not shown), a high-k dielectric layer (not shown), and a metal gate layer. The interfacial layer may be formed first. The interfacial layer may wrap around and contact each side of each of the elongated semiconductor materials 122. The interfacial layer may include an oxide-containing material such as silicon oxide or silicon oxynitride, and may be formed by chemical oxidation using an oxidizing agent (e.g., hydrogen peroxide ($H_2O_2$), ozone ($O_3$)), plasma enhanced atomic layer deposition, thermal oxidation, ALD, CVD, and/or other suitable methods.

After the interfacial layer is formed, a high-k dielectric layer may be formed around each of the elongated semiconductor features 122 over the interfacial layer. The high-k dielectric material has a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide, strontium titanate, hafnium oxynitride ($HfO_xN_y$), other suitable metal-oxides, or combinations thereof. The high-k dielectric layer may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

After the interfacial layer and high-k dielectric layer are formed, the gate layer may be formed. The gate layer includes a conductive material such as a metal material. For example, the gate layer may include tungsten, titanium, tantalum, or other suitable metal gate material. The gate layer may be formed using a variety of suitable deposition processes. In the present example, the gate layer also interconnects multiple transistors (formed by the multiple elongated structure stacks) shown within the first region 110. The present example illustrates a gate-all-around (GAA) structure in which the gate is wrapped all around the nanowire structure. In some examples, however, the gate structure may wrap partially around the nanowire structure.

Figure 1I:
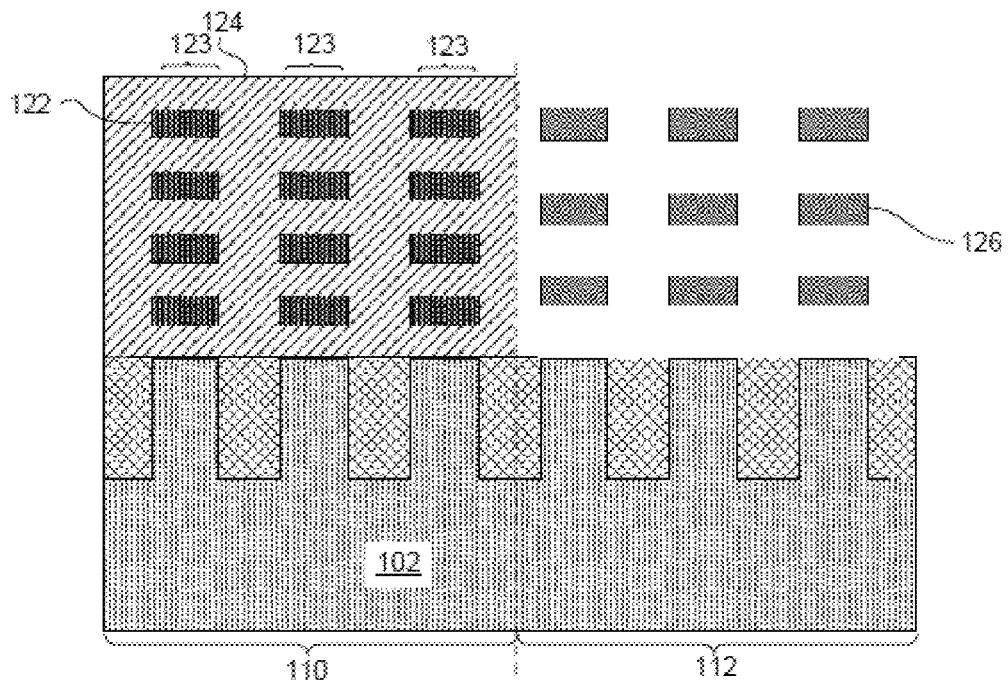
Figure 1J:
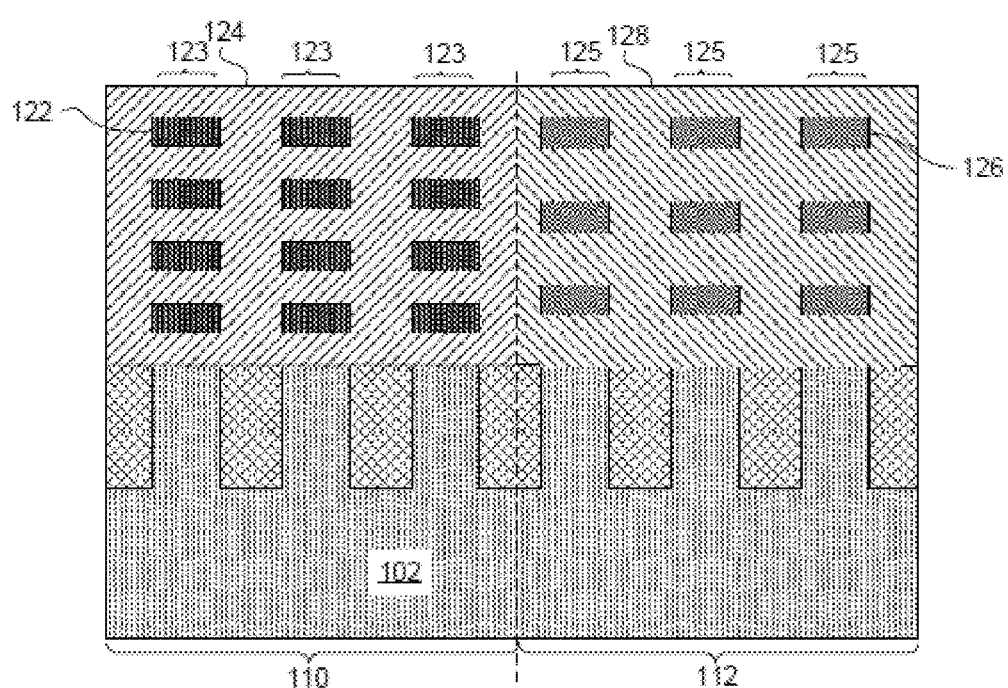

FIGS. 1I and 1J illustrate formation of gate devices for transistors within the second region 112. FIG. 1I illustrates removal of one of the types of semiconductor material of the second semiconductor stack features 118. Specifically, the material forming the second plurality of semiconductor layers 108 is removed. Such material may be removed using an isotropic etching process such as a wet etching process. Removal of such material leaves a number of elongated semiconductor features 126 suspended between the source and drain regions (not shown).

In some examples, after the elongated semiconductor features 126 have been exposed, an additional epitaxial growth process may be applied to change the size and/or shape of the elongated semiconductor features 126. For example, it may be desired to slightly increase the width and/or thickness of the cross-section of the elongated semiconductor features 126. In some cases, an isotropic etching process may be used to reduce the size of the exposed elongated semiconductor features 126. Such epitaxial growth or etching processes may be used to tune the dimensions of the elongated semiconductor features 126 as desired. For example, the cross-sectional shape of the elongated semiconductor features 126 may be rectangular, square, circular, elliptical, diamond, or other shape. The size and shape of the elongated semiconductor features 126 may be different than the size and shape of the elongated semiconductor features 122.

FIG. 1J illustrates formation of a gate structure 128 within the second region 112. In the present example, the gate structure 128 wraps around each side of the elongated semiconductor features 126. The gate structure 128 also electrically connects the gate devices for a number of stacked nanowire transistors 125 formed within the second region 112.

In some examples, the elongated semiconductor features 126 may also undergo various treatment and cleaning processes before the gate structure 128 is formed. The gate structure 128 may also include a number of materials. For example, like the gate structure 124, gate structure 128 may include an interfacial layer, a high-k dielectric layer, and a metal gate layer. In some examples, the thicknesses of the interfacial layer and the high-k dielectric layer for the gate structure 128 may be different than the thicknesses of the interfacial layer and the high-k dielectric layer for the gate structure 124. The metal material used for the gate structure 128 may be different than the metal material used for gate structure 124.

While the stacked nanowire transistors 123, 125 have varying characteristics, such as different thicknesses, different pitches, and different number of nanowires, the top surfaces of the top-most elongated semiconductor features 122, 126 from both stacked nanowire transistors 123, 125 are substantially coplanar. Thus, despite different device characteristics, regions 110 and 112 of the wafer are substantially planar. This simplifies formation of subsequent layers. For example, an interlayer dielectric layer (ILD) may be formed on top of the stacked nanowire transistors 123, 125. Various interconnects may then be formed within the ILD layer. In some examples, the bottom surfaces of the bottom-most elongated semiconductor features 122, 126 may be substantially coplanar. In some examples, however, the bottom surfaces of the bottom-most elongated semiconductor features 122, 126 may be offset from each other.

Figure 1K:
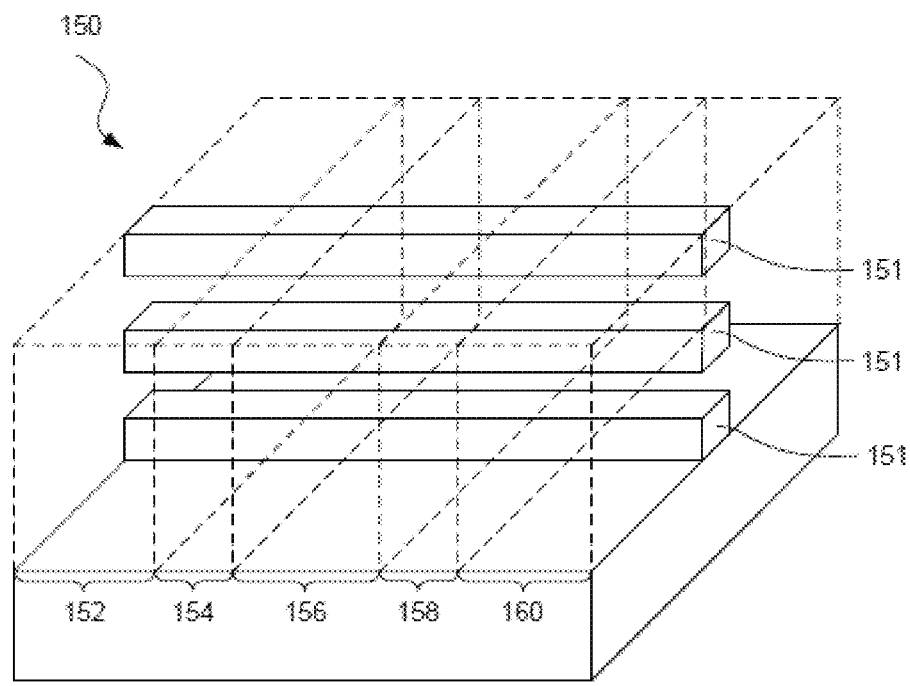
FIG. 1K is a diagram showing a perspective view of a stacked nanowire transistor, according to one example of principles described herein.

FIG. 1K is a diagram showing a perspective view of a stacked nanowire transistor 150 that includes a stack of elongated semiconductor features 151. The stacked nanowire transistor 150 may correspond to one of the stacked nanowire transistors 123, 125 shown in FIG. 1J. The elongated semiconductor features 151 may correspond to the elongated semiconductor features 122, 126 shown in FIG. 1J. According to the present example, the elongated semiconductor features 151 are shown stacked on top of each other. The stacked nanowire transistor 150 includes a first source/drain region 152, a first spacer 154, a gate region 156, a second spacer 158, and a second source/drain region 160. The first spacer 154 is positioned between the first source/drain region 152 and the gate region 156. The second spacer 158 is positioned between the gate region 156 and the second source/drain region 160. FIGS. 1A-1J illustrate a cross-section through the gate region 156 as the stacked nanowire transistor 150 is formed.

The portions of the elongated semiconductor features 151 that pass through the gate region 156 function as a channel for the stacked nanowire transistor 150. The portions of the elongated semiconductor features 151 that pass through the source/drain regions 152, 160 function as a source and drain for the stacked nanowire transistor 150. The source/drain regions 152/160 may be electrically connected to source/drain contacts (not shown). Similarly, the gate region 156 may be electrically connected to a gate contact (not shown). Thus, the stacked nanowire transistor 150 is able to function within the integrated circuit.

Figure 2A:
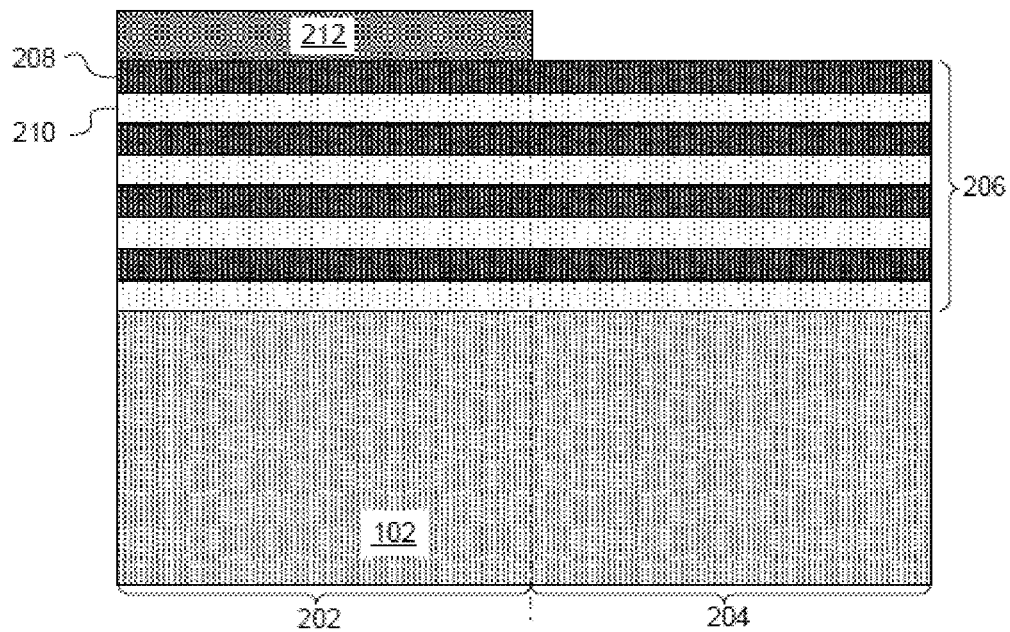
FIGS. 2A, 2B, 2C, 2D, 2E, and 2F are diagrams showing an illustrative process for forming stacked nanowire transistors having various characteristics, according to one example of principles described herein.

FIGS. 2A, 2B, 2C, 2D, 2E, and 2F are diagrams showing an illustrative process for forming stacked nanowire transistors having various characteristics. FIGS. 2A-2F illustrate a process in which the second semiconductor stack is formed before both semiconductor stacks are patterned. FIG. 2A illustrates a first semiconductor stack 206 formed onto a semiconductor substrate 102. The semiconductor stack 206 includes a first plurality of semiconductor layers 208 and a second plurality of semiconductor layers 210. The semiconductor stack 206 alternates between the first plurality of semiconductor layers 208 and the second plurality of semiconductor layers 210.

In the present example, two different regions 202, 204 of the semiconductor substrate 102 are shown. These regions 202, 204 may or may not be adjacent to each other. As will be explained in further detail below, a first type of stacked nanowire transistor will be formed in the first region 202 and a second type of stacked nanowire transistor will be formed in the second region 204. These two different devices will have varying characteristics.

Each of the plurality of semiconductor layers 208, 210 may be grown through use of an epitaxial growth process. In one example, the first plurality of semiconductor layers 208 may be made of silicon. The second plurality of semiconductor layers 210 may be made of silicon germanium. As will be described in further detail below, the two different materials used for the first plurality of semiconductor layers 208 and the second plurality of semiconductor layers 210 are selected so that they may be selectively etched. Because the second plurality of semiconductor layers 210 will eventually be removed, it is desirable to have an etching process that will remove the second plurality of semiconductor layers 210 while leaving the first plurality of semiconductor layers 208 substantially intact. Other semiconductor materials may be used. For example, either the first plurality of semiconductor layers 208 or the second plurality of semiconductor layers 210 may be made of germanium (Ge), silicon germanium (SiGe), germanium tin (GeSn), silicon germanium tin (SiGeSn), or a III-V semiconductor.

According to the present example, a patterned mask 212 is used to protect some regions of the semiconductor stack 206 while exposing other regions of the semiconductor stack 206. Specifically, the regions intended to be replaced are exposed and the regions intended to remain are covered by the patterned mask 212. In the present example, the patterned mask 212 protects the semiconductor stack 206 over the first region 202 while exposing the semiconductor stack 206 over the second region 204.

Figure 2B:
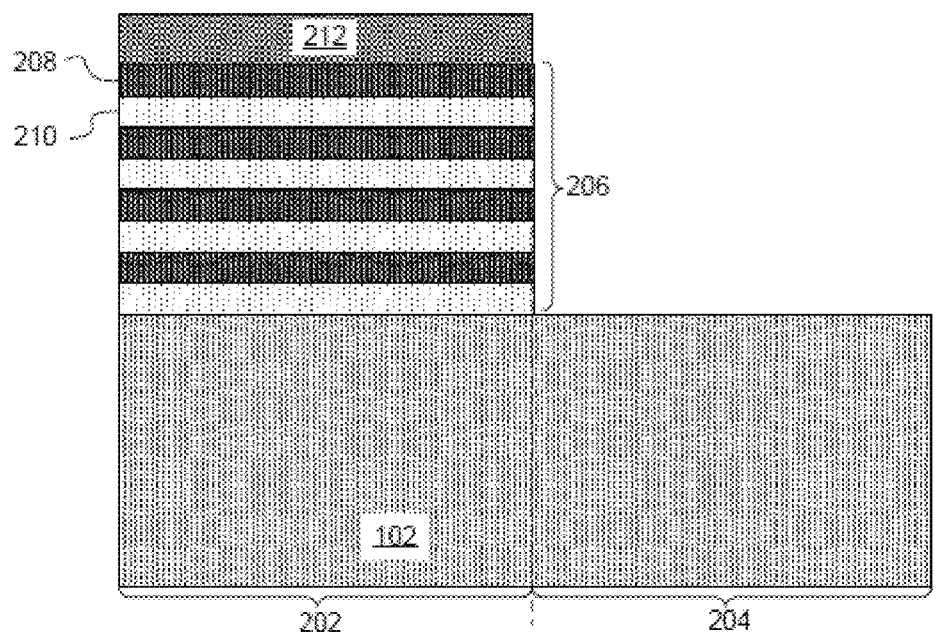

FIG. 2B is a diagram showing removal of the exposed regions of the semiconductor stack 206. The exposed regions, i.e., region 204, may be removed using an anisotropic etching process such as a dry etching process. During such a process, the patterned mask 212 protects the semiconductor stack 206 over the first region 202.

Figure 2C:
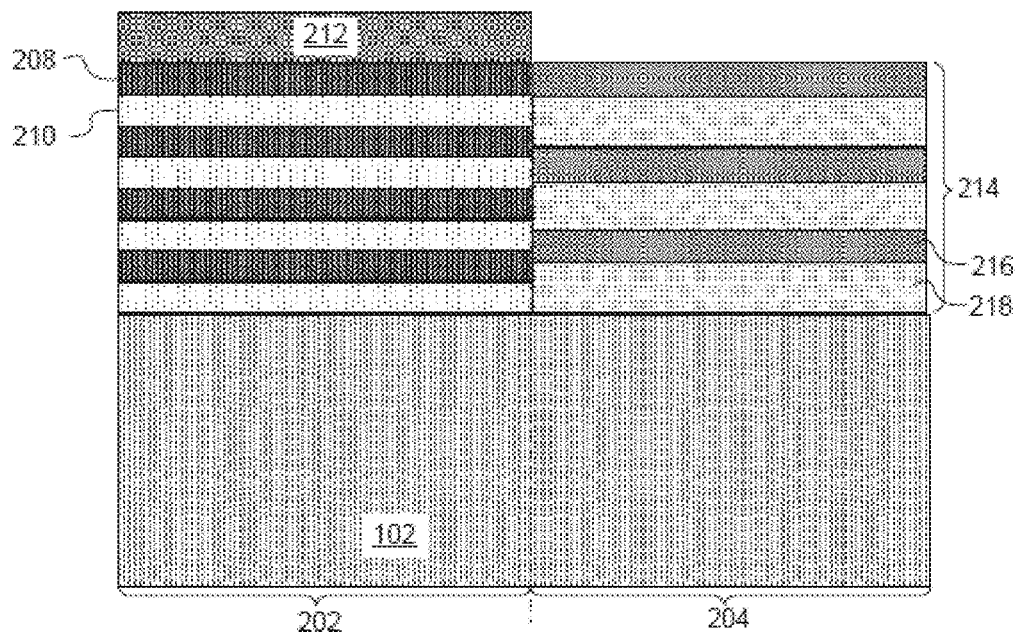

FIG. 2C is a diagram showing an illustrative formation process to form a second semiconductor stack 214 within the second region 204. The second semiconductor stack 214 alternates between a first plurality of semiconductor layers 216 and a second plurality of semiconductor layers 218. The second semiconductor stack 214 is similar to the first semiconductor stack 206 but has varying characteristics. For example, the second semiconductor stack 214 may have different semiconductor materials than the first semiconductor stack 206. Additionally, the second semiconductor stack 214 may have a different number of layers than the first semiconductor stack 206. The layers within the second semiconductor stack 214 may have different thicknesses and pitches than the layers of the first semiconductor stack 206. The second semiconductor stack may be formed using an epitaxial growth process. After the second semiconductor stack 214 has been formed, a CMP process may be used to planarize the top surface of the wafer.

Figure 2D:
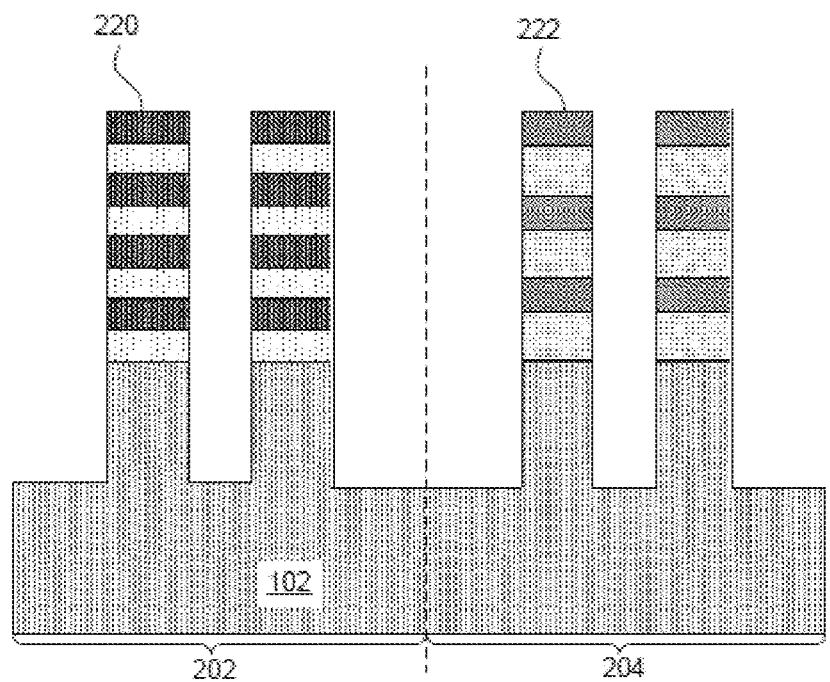

FIG. 2D illustrates a patterning process to form a first set of semiconductor stack features 220 within the first region 202 and a second set of semiconductor stack features 222 within the second region 204. Such patterning may be similar to the patterning described above in accordance with the text accompanying FIG. 1B. The patterning may result in fin structures within the semiconductor substrate 102.

Figure 2E:
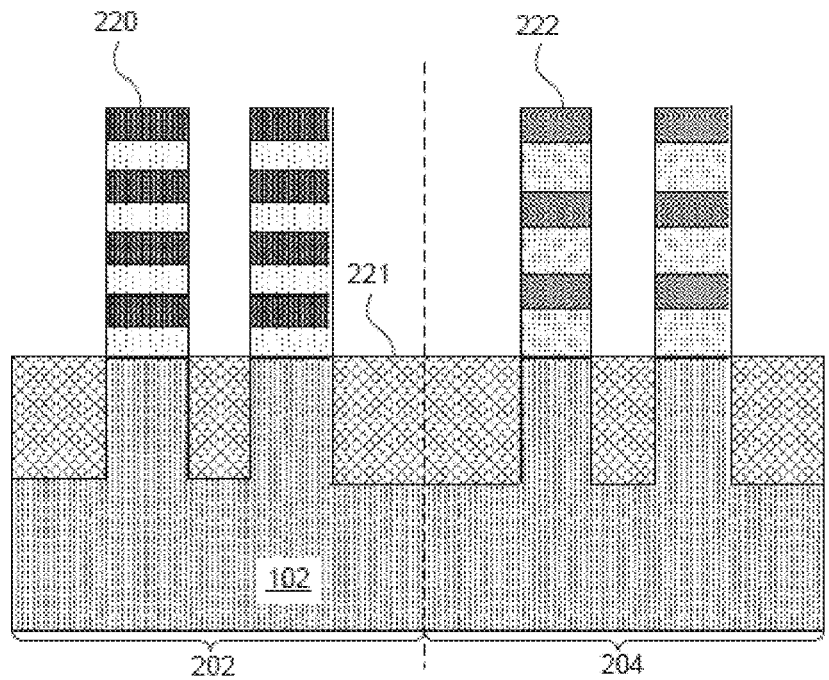

FIG. 2E is a diagram showing formation of isolation regions 221 between the semiconductor stack features 220, 222. The isolation features 221 may be formed by depositing a dielectric material within the spaces between the semiconductor stack features 220, 222. Then, an etching process may be used to tune the height of the isolation features so that they are substantially coplanar with the top-most surfaces within the semiconductor substrate 102. In some examples, top surfaces of the isolation features 221 are lower than the top-most surfaces of the semiconductor substrate 102. The isolation features 221 may be formed in a manner similar to the isolation features described above in accordance with the text accompanying FIGS. 1E-1F.

Figure 2F:
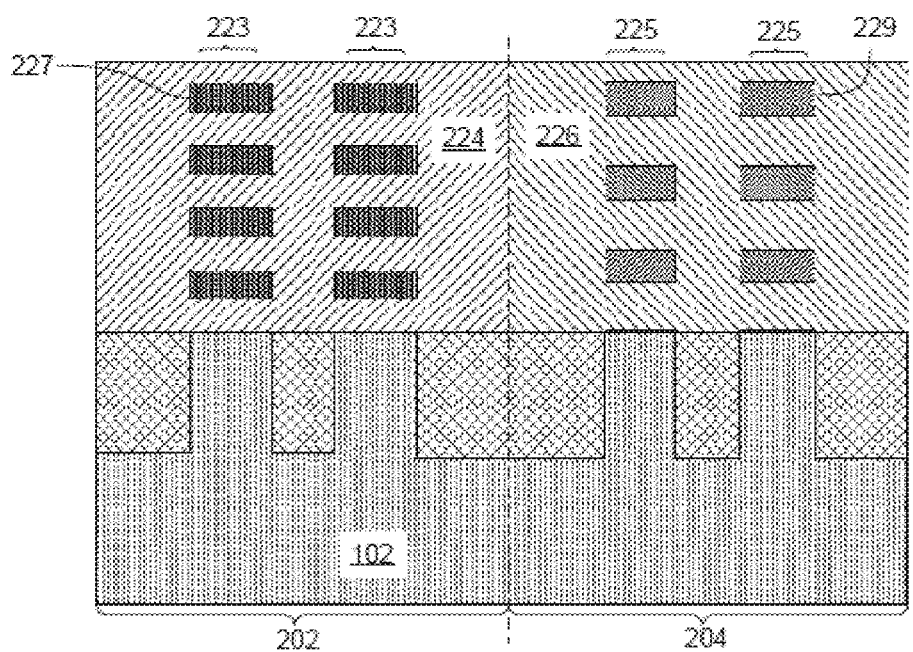

FIG. 2F is a diagram showing a first set of stacked nanowire transistors 223 within the first region 202 and a second set of stacked nanowire transistors 225 within the second region 204. The stacked nanowire transistors 223, 225 may be formed similar to the stacked nanowire features described above in the text accompanying FIGS. 1G-1J. Specifically, for the first region 202, the second plurality of semiconductor layers 210 are removed from the semiconductor stack features 220. Then, a gate device 224 is formed around each of the remaining elongated semiconductor features 227 of the stacked nanowire transistors 223. For the second region 204, one type of semiconductor material is removed from the semiconductor stack features 222. Then, a gate device 226 is formed around each of the remaining elongated semiconductor features 229 of the stacked nanowire transistors 225.

While FIGS. 2A-2F illustrate a process by which two different types of stacked nanowire transistors are formed, other processes using principles described herein may be used to form more than two types of stacked nanowire transistors. For example, a portion of the first semiconductor stack may be removed from a third region. Then, a third semiconductor stack may be formed within the third region. The third semiconductor stack may have features that vary from both the first semiconductor stack 206 and the second semiconductor stack 214.

Figure 3A:
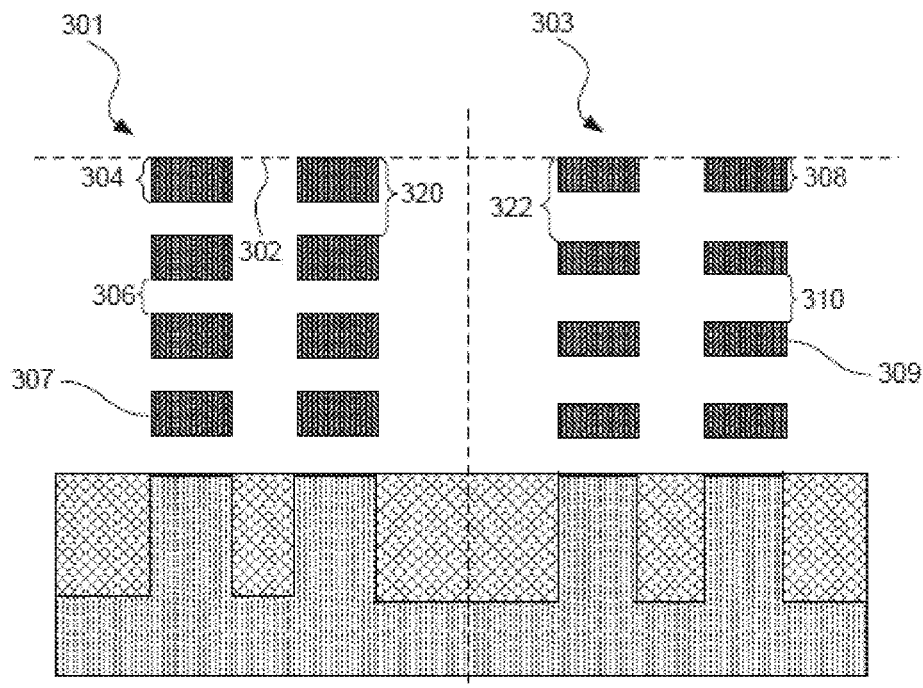
FIGS. 3A and 3B are diagrams showing illustrative stacked nanowire transistors having various characteristics, according to one example of principles described herein.
Figure 3B:
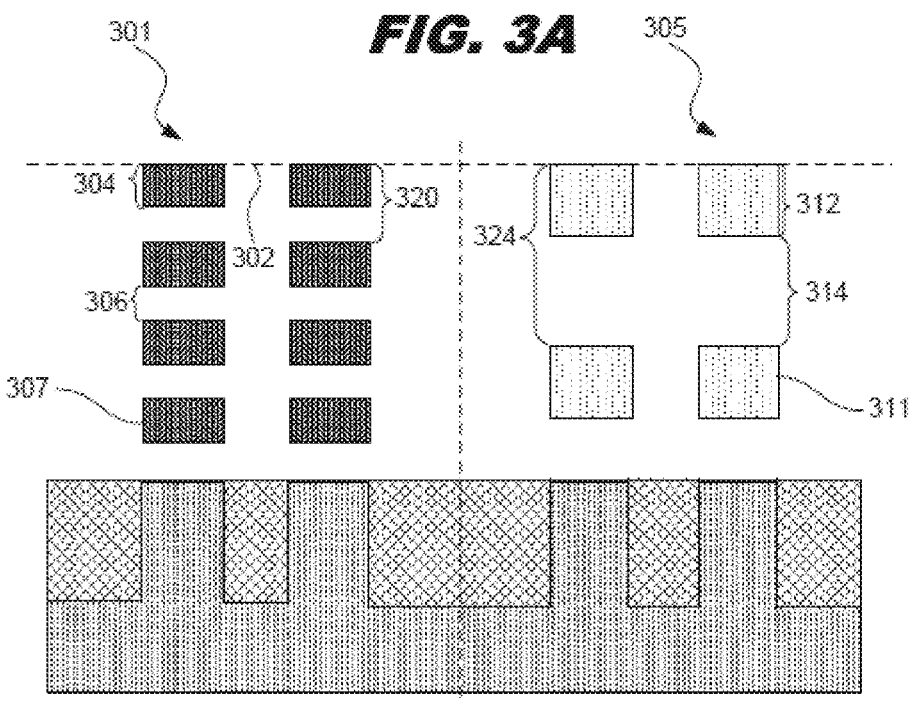

FIGS. 3A and 3B are diagrams showing illustrative stacked nanowire transistors with various characteristics. FIG. 3A illustrates a first type of stacked nanowire transistor 301 and a second type of stacked nanowire transistor 303. Each of the first type of stacked nanowire transistors 301 has four elongated semiconductor features 307 that are vertically stacked. Each of the second type of stacked nanowire transistors 303 also has four elongated semiconductor features 309 that are vertically stacked. Thus, in the present example, both types of stacked nanowire transistors 301, 303 have the same number of elongated semiconductor features in each transistor. Additionally, both the elongated semiconductor features 307 and the elongated semiconductor features 309 are made of the same semiconductor material.

In the present example, the thickness 308 of the elongated semiconductor features 309 is smaller than the thickness 304 of the elongated semiconductor features 307. Additionally, the space 310 between the elongated semiconductor features 309 is larger than the space 306 between the elongated semiconductor features 307. Consequently, the pitch 322 between the elongated semiconductor features 309 is different than the pitch 320 between the elongated semiconductor features 307. In some examples, as is the case for stacked nanowire transistor 301, the space 306 between elongated semiconductor features 307 is equal to the thickness 304 of the elongated semiconductor features 307. However, the space 310 between elongated semiconductor features 309 is different than the thickness 308 of elongated semiconductor features 309. In the present example, the space 310 is larger than the thickness 308. In some examples, however, the space between elongated semiconductor features may be less than the thickness of the elongated semiconductor features. The thickness of the elongated semiconductor features 307, 309 may be within a range of about 3-20 nanometers. Furthermore, in the present example, the top surfaces of the top-most elongated semiconductor feature 307, 309 of both types of stacked nanowire transistor 301, 303 are substantially coplanar along plane 302.

FIG. 3B illustrates a first type of stacked nanowire transistor 301 and a third type of stacked nanowire transistor 305. While the first type of stacked nanowire transistor 301 has four elongated semiconductor features 307, the third type of stacked nanowire transistor 305 has only two elongated semiconductor features 311 that are vertically stacked. Thus, first type of stacked nanowire transistor 301 has a different number of elongated semiconductor features than the third type of stacked nanowire transistor 305. Additionally, the elongated semiconductor features 311 are made of a different semiconductor material than the elongated semiconductor features 307.

In the present example, the thickness 312 of the elongated semiconductor feature 311 is greater than the thickness 304 of the longest semiconductor features 307. Additionally, the space 314 between the elongated semiconductor features 211 is greater than the space 306 between the elongated semiconductor features 307. Consequently, the pitch 324 between the elongated semiconductor features 311 is different than the pitch 320 between the elongated semiconductor features 307. Furthermore, the top surfaces of the top-most elongated semiconductor feature 307, 311 of both types of stacked nanowire transistor 301, 305 are substantially coplanar along plane 302.

Figure 4:
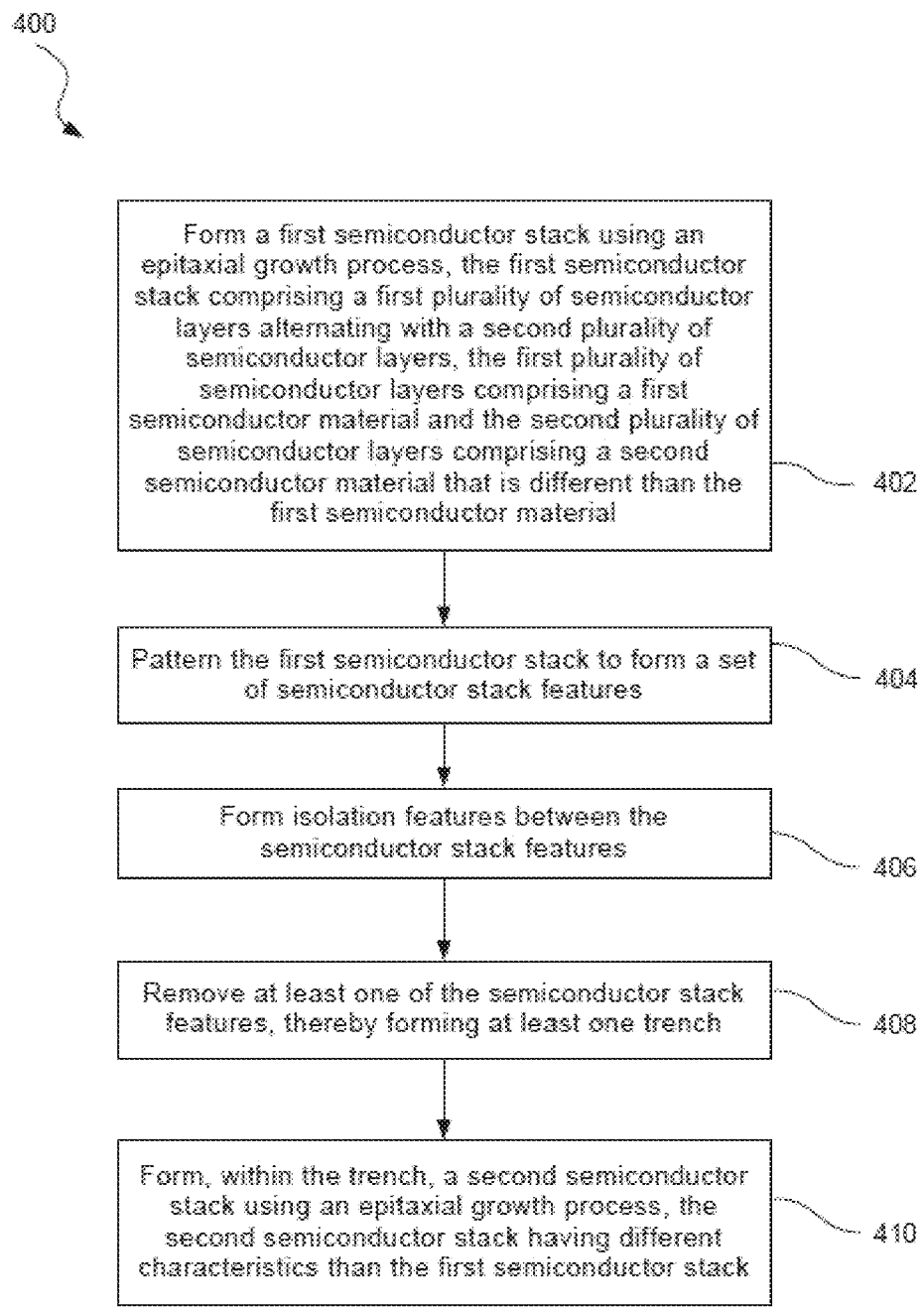
FIG. 4 is a flowchart showing an illustrative method for forming stacked nanowire transistors having various characteristics, according to one example of principles described herein.

FIG. 4 is a flowchart showing an illustrative method 400 for forming stacked nanowire transistors having various characteristics and in which the semiconductor stack for a second type of stacked nanowire transistor is formed after the semiconductor stack for the first type of stacked nanowire transistor is patterned. According to the present example, the method 400 includes a step 402 for forming a first semiconductor stack using an epitaxial growth process. The first semiconductor stack includes a first plurality of semiconductor layers alternating with a second plurality of semiconductor layers. The first plurality of semiconductor layers includes a first semiconductor material and the second plurality of semiconductor layers includes a second semiconductor material that is different than the first semiconductor material. Both the first plurality of semiconductor layers and the second plurality semiconductor layers may be formed as described above in the text accompanying FIG. 1A.

According to the present example, the method 400 further includes a step 404 for patterning the first semiconductor stack to form a set of semiconductor stack features. The set of semiconductor stack features may include features that will ultimately become a first type of stacked nanowire transistor and features that will become a second type of stacked nanowire transistor. The patterning process may be performed as described above in accordance with the text accompanying FIG. 1B.

According to the present example, the method 400 further includes a step 406 for forming isolation features between the semiconductor stack features. The isolation features may be formed in a first region corresponding to the first type of stacked nanowire transistor and a second region corresponding to the second type of stacked nanowire transistor. The isolation features may be formed as described above in the text accompanying FIG. 1C.

According to the present example, the method 400 further includes a step 408 for removing at least one of the semiconductor stack features, thereby forming at least one trench. For example, one of the semiconductor stack features within the region corresponding to the second type of stacked nanowire transistor is removed. Such a removal process may be performed as described above in the text accompanying FIG. 1D.

According to the present example, the method 400 further includes a step 410 for forming, within the trench, a second semiconductor stack using an epitaxial growth process, the second semiconductor stack having different characteristics than the first semiconductor stack. The second semiconductor stack will ultimately become a second type of stacked nanowire transistor. Forming the second semiconductor stack may be performed as described above the text accompanying FIG. 1E. Both the first type of stacked nanowire transistor and the second type of stacked nanowire transistor may be completed as described above in the text accompanying FIGS. 1F-1J.

Figure 5:
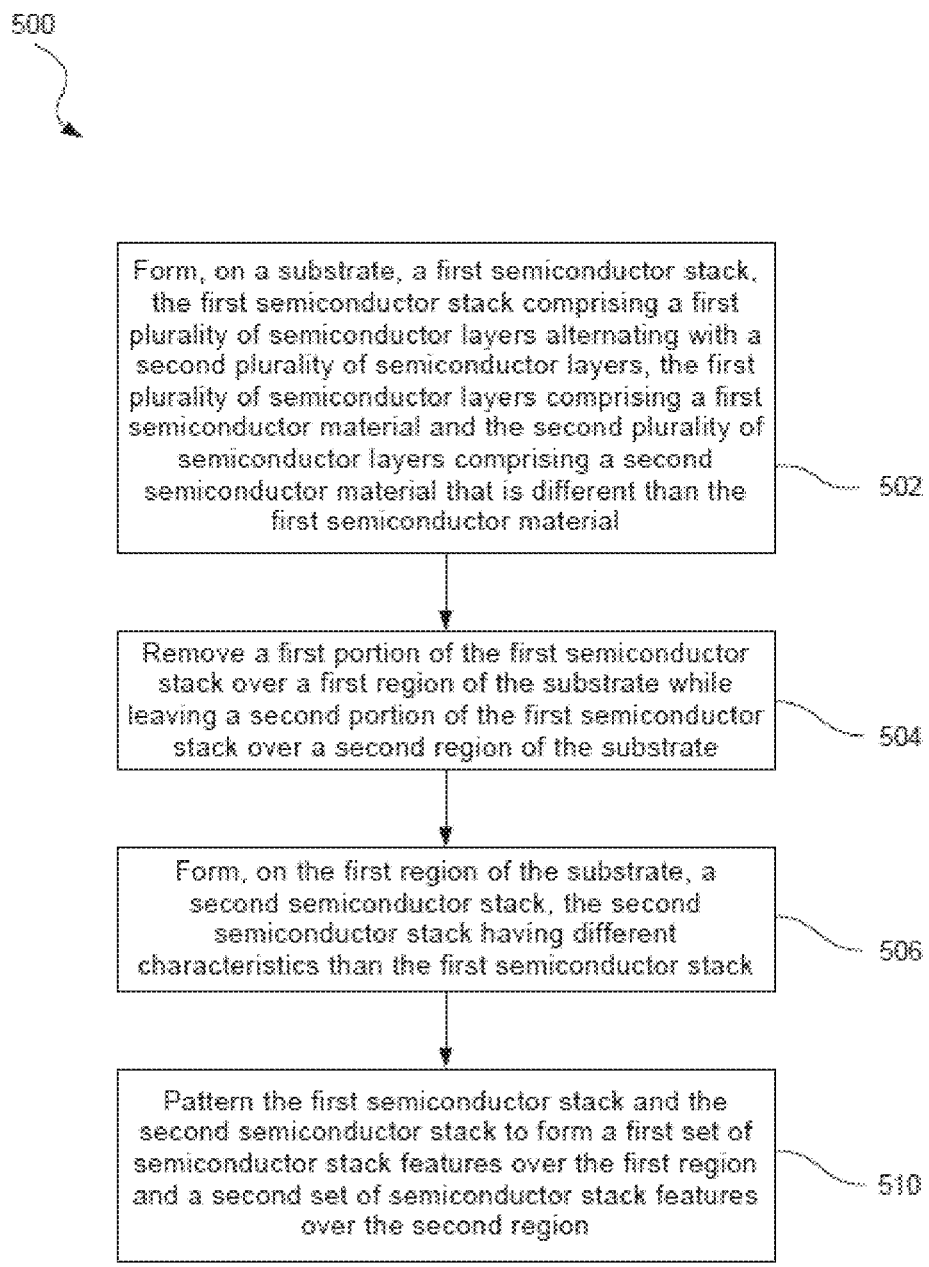
FIG. 5 is a flowchart showing an illustrative method for forming stacked nanowire transistors having various characteristics, according to one example of principles described herein.

FIG. 5 is a flowchart showing an illustrative method for forming stacked nanowire transistors having various characteristics and in which the semiconductor stacks for both a first type of stacked nanowire transistor and a second type of stacked nanowire transistor are formed before the semiconductor stacks for both types of stacked nanowire transistors are patterned. According to the present example, the method 500 includes a step 502 for forming, on a substrate, a first semiconductor stack. The first semiconductor stack includes a first plurality of semiconductor layers alternating with a second plurality of semiconductor layers, the first plurality of semiconductor layers includes a first semiconductor material and the second plurality of semiconductor layers includes a second semiconductor material that is different than the first semiconductor material. The first semiconductor stack may be formed as described above in the text accompanying FIG. 2A.

According to the present example, the method 500 further includes a step 504 for removing a first portion of the first semiconductor stack over a first region of the substrate while leaving a second portion of the first semiconductor stack over a second region of the substrate. This may be done using various photolithographic patterning techniques. For example, this may be done as described above in the text accompanying FIG. 2B. In this case, the first region corresponds to region 204 and the second region corresponds to region 202.

According to the present example, the method 500 further includes a step 506 for forming, on the first region of the substrate, a second semiconductor stack, the second semiconductor stack having different characteristics than the first semiconductor stack. Second semiconductor stack formed in a manner similar to that of the first semiconductor stack. The second semiconductor stack may be formed as described above the text accompanying FIG. 2C.

According to the present example, the method 500 further includes a step 508 for patterning the first semiconductor stack and the second semiconductor stack to form a first set of semiconductor stack features over the first region and a second set of semiconductor stack features over the second region. This patterning process may be formed as described above in the text accompanying FIG. 2D. In this case, the first set of semiconductor stack features correspond to features 222 and the second set of semiconductor stack features correspond to features 220. The stacked nanowire transistors may then be completed as described in the FIGS. 2E-2F.

The methods and processes described herein may be used in accordance with methods to form finFET and planar transistors. For example, some types of transistors within the circuit may include the stacked nanowire transistors as described above and some transistors within the integrated circuit may be finFET transistors or planar transistors. In one example, core transistors are different types of stacked nanowire transistors as described above and input/output transistors are finFET or planar transistors. Other combinations are contemplated as well.

In some embodiments represented in FIGS. 6A-6F, a semiconductor may simultaneously include different types of finFET transistor and different types of stacked nanowire transistors for different applications. Reference is first made to FIG. 6A, shown therein is a cross-sectional view of an active region 603 for a finFET transistor 602. The active region 603 is fin-shaped and extend lengthwise over the semiconductor substrate 102 along the Y direction. The active region 603 include silicon. As shown in FIG. 6A, the active region 603 includes a first width W1 along the X direction. FIG. 6B illustrates a cross-sectional view of an active region 616 for a p-type fully strained channel (PFSC) transistor 604. The active region 616 may be formed of silicon germanium and may include a silicon top layer 614. The active region 616 is fin-shaped and extend lengthwise over the semiconductor substrate 102 along the Y direction. As shown in FIG. 6B, the active region 616 and the silicon top layer 614 include a first width W1 along the X direction. FIG. 6C illustrates a cross-sectional view of an active region of a first stacked nanowire transistor 606. The active region of the first stacked nanowire transistor 606 includes a stack of alternating elongated semiconductor features 618 and elongated semiconductor feature 620. The elongated semiconductor features 618 are sacrificial features and may include germanium. The elongated semiconductor features 620 will become the channel regions and may include silicon. The active region 616 is fin-shaped and extend lengthwise over the semiconductor substrate 102 along the Y direction. Each of the elongated semiconductor features 620 has a first thickness T1 and each of the elongated semiconductor features 618 has the second thickness T2. In some instances shown in FIG. 6C, the first thickness T1 is substantially similar to the second thickness T2. As shown in FIG. 6C, the active region of the first stacked nanowire transistor 606 include the first width W1.

FIG. 6D illustrates a cross-sectional view of an active region of a second stacked nanowire transistor 608. The active region of the second stacked nanowire transistor 608 includes a stack of alternating elongated semiconductor features 628 and elongated semiconductor feature 630. The elongated semiconductor features 628 are sacrificial features and may include germanium. The elongated semiconductor features 630 will become the channel regions and may include silicon. The active region is fin-shaped and extend lengthwise over the semiconductor substrate 102 along the Y direction. Each of the elongated semiconductor features 630 has a third thickness T3 and each of the elongated semiconductor features 628 has a fourth thickness T4. In some instances shown in FIG. 6D, the fourth thickness T4 is greater than the third thickness T3. As shown in FIG. 6D, the active region of the second stacked nanowire transistor 608 include the first width W1. FIG. 6E illustrates a cross-sectional view of an active region of a third stacked nanowire transistor 610. The active region of the third stacked nanowire transistor 610 includes a stack of alternating elongated semiconductor features 638 and elongated semiconductor feature 640. The elongated semiconductor features 638 are sacrificial features and may include germanium. The elongated semiconductor features 640 will become the channel regions and may include silicon. The active region is fin-shaped and extend lengthwise over the semiconductor substrate 102 along the Y direction. Each of the elongated semiconductor features 638 has a sixth thickness T6 and each of the elongated semiconductor features 640 has a fifth thickness T5. In some instances, the fifth thickness T5 is greater than the sixth thickness T6. As shown in FIG. 6E, the active region of the third stacked nanowire transistor 610 include the first width W1. FIG. 6F illustrates a cross-sectional view of an active region of a fourth stacked nanowire transistor 612. The active region of the fourth stacked nanowire transistor 612 includes a stack of alternating elongated semiconductor features 648 and elongated semiconductor feature 650. The elongated semiconductor features 648 are sacrificial features and may include germanium. The elongated semiconductor features 650 will become the channel regions and may include silicon. The active region is fin-shaped and extend lengthwise over the semiconductor substrate 102 along the Y direction. Each of the elongated semiconductor features 648 has an eighth thickness T8 and each of the elongated semiconductor features 650 has a seventh thickness T7. In some instances, the eighth thickness T8 is greater than the seventh thickness T7. As shown in FIG. 6F, the active region of the fourth stacked nanowire transistor 612 include a second width W2, which is greater than the first width W1.

More than one of the active regions illustrated in FIGS. 6A-6F may be fabricated on the same workpiece to form a single semiconductor device. When any two of them are formed on a workpiece that includes the semiconductor substrate 102, they may have the same height H measured from isolation feature 221 as a result of a planarization process. In some instances, the height measurement from the isolation feature 221 may not be reliable due to loading effect during etch back processes. In those instances, the common height H may be measured from a top surface or even a bottom surface of the semiconductor substrate 102.

Reference is now made to FIGS. 7A-7F, which illustrates further processes to be performed on the active regions shown in FIGS. 6A-6F. As shown in FIGS. 7A and 7B, the active regions of the finFET 602 and the PFSC transistor 604 are not subject to etch processes for release of any nanostructure. Therefore, the active region 603 maintains the height H and the active region 616 and the silicon top layer 614 together maintains the height H. The same cannot be said for the first stacked nanowire transistor 606, the second stacked nanowire transistor 608, the third stacked nanowire transistor 610, and the fourth stacked nanowire transistor 612 as they undergo nanostructure release processes. As illustrated in FIG. 7C, the elongated semiconductor features 618 of the first stacked nanowire transistor 606 are removed to release the elongated semiconductor features 620 such that the elongated semiconductor features 620 become suspended. In some embodiments, ozone is used to selectively oxidize germanium in the elongated semiconductor features 618 and a selective etch process is performed to remove oxidized elongated semiconductor features 618. While the release process is configured to be selective, the elongated semiconductor features 620 may nevertheless be etched and have reduced dimensions. In FIG. 7C, the elongated semiconductor features 620 with reduced dimensions are given reference numerals 620'. Both the width and thickness of the released elongated semiconductor features 620' are reduced. In FIG. 7C, the released elongated semiconductor features 620' each have a first reduced width W11 and a first reduced thickness T11. The first reduced width W11 is smaller than the first width W1 and the first reduced thickness T11 is smaller than the first thickness T1. The reduced dimensions of the released elongated semiconductor features 620' result in a reduced height H', which is smaller than the height H in FIG. 6C.

As illustrated in FIG. 7D, the elongated semiconductor features 628 of the second stacked nanowire transistor 608 are removed to release the elongated semiconductor features 630 such that the elongated semiconductor features 630 become suspended. In some embodiments, ozone is used to selectively oxidize germanium in the elongated semiconductor features 628 and a selective etch process is performed to remove oxidized elongated semiconductor features 628. While the release process is configured to be selective, the elongated semiconductor features 630 may nevertheless be etched and have reduced dimensions. In FIG. 7D, the elongated semiconductor features 630 with reduced dimensions are given reference numerals 630'. Both the width and thickness of the released elongated semiconductor features 630' are reduced. In FIG. 7D, the released elongated semiconductor features 630' each have the first reduced width W11 and a third reduced thickness T31. The first reduced width W11 is smaller than the first width W1 and the third reduced thickness T31 is smaller than the third thickness T3. The reduced dimensions of the released elongated semiconductor features 630' result in a reduced height H', which is smaller than the height H in FIG. 6D.

As illustrated in FIG. 7E, the elongated semiconductor features 638 of the third stacked nanowire transistor 610 are removed to release the elongated semiconductor features 640 such that the elongated semiconductor features 640 become suspended. In some embodiments, ozone is used to selectively oxidize germanium in the elongated semiconductor features 638 and a selective etch process is performed to remove oxidized elongated semiconductor features 638. While the release process is configured to be selective, the elongated semiconductor features 640 may nevertheless be etched and have reduced dimensions. In FIG. 7E, the elongated semiconductor features 640 with reduced dimensions are given reference numerals 640'. Both the width and thickness of the released elongated semiconductor features 640' are reduced. In FIG. 7E, the released elongated semiconductor features 640' each have the first reduced width W11 and a fifth reduced thickness T51. The first reduced width W11 is smaller than the first width W1 and the fifth reduced thickness T51 is smaller than the fifth thickness T5. The reduced dimensions of the released elongated semiconductor features 640' result in a reduced height H', which is smaller than the height H in FIG. 6E.

As illustrated in FIG. 7F, the elongated semiconductor features 648 of the fourth stacked nanowire transistor 612 are removed to release the elongated semiconductor features 650 such that the elongated semiconductor features 650 become suspended. In some embodiments, ozone is used to selectively oxidize germanium in the elongated semiconductor features 648 and a selective etch process is performed to remove oxidized elongated semiconductor features 648. While the release process is configured to be selective, the elongated semiconductor features 650 may nevertheless be etched and have reduced dimensions. In FIG. 7F, the elongated semiconductor features 650 with reduced dimensions are given reference numerals 650'. Both the width and thickness of the released elongated semiconductor features 650' are reduced. In FIG. 7F, the released elongated semiconductor features 650' each have a second reduced width W21 and a seventh reduced thickness T71. The second reduced width W21 is smaller than the second width W2 and the seventh reduced thickness T71 is smaller than the seventh thickness T7. The reduced dimensions of the released elongated semiconductor features 650' result in a reduced height H', which is smaller than the height H in FIG. 6F.

The first stacked nanowire transistor 606, the second stacked nanowire transistor 608, the third stacked nanowire transistor 610, and the fourth stacked nanowire transistor 612 have nanowires of various dimensions and width-to-thickness ratios. In some instances, short-hand names may be assigned to them to describe their characteristics. In FIG. 7C, as a difference between the first reduced thickness T11 and the first reduced width W11 is less than 50%, each of the released elongated semiconductor features 620' may be referred to as a nanowire. In FIG. 7D, as the first reduced width W11 is greater than about 1.5 times of the third reduced thickness T31, each of the released elongated semiconductor features 630' may be referred to as a nanosheet. In FIG. 7E, as the fifth reduced thickness T51 is greater than about 1.5 times of the first reduced width T11, each of the released elongated semiconductor features 640' may be referred to as a vertical nanosheet or a nanosheet. In FIG. 7F, as the second reduced with W21 is greater than about 1.5 times of the seventh reduced width T71, each of the released elongated semiconductor features 650' may be referred to as a nanosheet or a nanosheet. These nanowires and nanosheets may be collectively referred to as nanostructures, channel members, suspended channels, or suspended members without specifying their width-to-thickness ratios.

The transistors shown in FIGS. 7A-7F are suitable for different applications and may be strategically implemented in different device regions in a semiconductor device. In some embodiments, a semiconductor device of the present disclosure may include more than one of a core (or logic) region, a storage region, a high-voltage region, and an input/output (I/O) region. A core region may include logic cells, such as inverter, NAND, NOR, AND, OR, or Flip-Flop cells and may require fast switching. A storage region may include static random access memory (SRAM) cells, dynamic random access memory (DRAM) cells, or flash memory cells and may require low leakage. An I/O region refers to a region that interfaces with external circuitry such as a printed circuit board (PCB). A transistor in the I/O region requires high drive current. A high-voltage region refers to a device region that operates at a voltage higher than an operating voltage of the core region. Like a transistor in the I/O region, a transistor in the high-voltage region also requires high drive current. In an example, a semiconductor device according to the present disclosure may include a core region, a storage region and an I/O region. In another example, a semiconductor device according to the present disclosure may include a core region, a storage region, a high-voltage region, and an I/O region. In yet another example, a semiconductor device according to the present disclosure may include a core region and an I/O region. In some embodiments, the finFET transistor 602 and the PFSC transistor 604 may be used in an I/O region or a high-voltage region as they have higher drive currents than stacked nanowire transistors. In some embodiments, the first stacked nanowire transistor 606, the second stacked nanowire transistor 608, the third stacked nanowire transistor 610, and the fourth stacked nanowire transistor 612 may be used in a core region or a storage region. In another embodiment, the fourth stacked nanowire transistor 612 may be used in an I/C region or a high-voltage region and the first stacked nanowire transistor 606 or the second stacked nanowire transistor 608 may be used in a core or a storage region. As compared to the first reduced width W11 of the first stacked nanowire transistor 606 or the second stacked nanowire transistor 608, the greater second reduced width W21 allows the fourth stacked nanowire transistor 612 to have higher drive currents. For avoidance of any doubt, the second reduced width W21 remains greater than the first width W1.

Although not explicitly shown in FIGS. 7A-7F, each of the active regions in FIGS. 7A-7F is wrapped around by a gate structure, such as a high-k metal gate structure that includes an interfacial layer, a high-k gate dielectric layer over the interfacial layer, at least one work function layer over the high-k gate dielectric layer, and a metal fill layer. For each of the first stacked nanowire transistor 606, the second stacked nanowire transistor 608, the third stacked nanowire transistor 610, and the fourth stacked nanowire transistor 612, the gate structure may completely wrap around each elongated semiconductor features in the Z-X plane.

While each of the first stacked nanowire transistor 606, the second stacked nanowire transistor 608, the third stacked nanowire transistor 610, and the fourth stacked nanowire transistor 612 is shown in FIGS. 7A-7F as having nanostructures of a uniform width-to-thickness ratio throughout the stack, differently situated nanostructures may have different width-to-thickness ratios. Reference is now made to FIGS. 8A-8E, which illustrates release of nanostructures (i.e. nanowires or nanosheets) in a stacked nanowire transistor 702. During fabrication of the stacked nanowire transistor 702, an active region that includes a stack of alternating elongated semiconductor features 718 and elongated semiconductor feature 720 is formed over a semiconductor substrate 102, as shown in FIG. 8A. In FIG. 8B, the elongated semiconductor feature 718 is then oxidized and then selectively etched by an etch process. The etch process etches the elongated semiconductor feature 718 from the exposed surface toward a center of each of the elongated semiconductor features 718. Additionally, in some embodiments, the etch process may exhibit vertical loading where the etch rate of the elongated semiconductor features 718 diminishes as the etchant travels from a top of the active region to a bottom of the active region. In FIG. 8B, as the etch process progresses, an elongated semiconductor feature etches faster than an underlying elongated semiconductor feature. As illustrated in FIG. 8B, the first elongated semiconductor feature 718-1 etches faster than the second elongated semiconductor feature 718-2, the second elongated semiconductor feature 718-2 etches faster than the third elongated semiconductor feature 718-3, and the third elongated semiconductor feature 718-3 etches faster than the fourth elongated semiconductor feature 718-4. Compared to the initial structure in FIG. 8A, the elongated semiconductor features 720 in FIG. 8B have rounded edges as a result of the etching. As the etch process progresses further, the first elongated semiconductor feature 718-1 and the second elongated semiconductor feature 718-2 may be completely removed, while the third elongated semiconductor feature 718-3 and the fourth elongated semiconductor feature 718-4 are etched further to become narrower (along the X direction) fifth elongated semiconductor feature 718-5 and sixth elongated semiconductor feature 718-6, as shown in FIG. 8C.

In order to completely release the elongated semiconductor features 720 by completely removing the elongated semiconductor features 718, over-etching may be necessary. Reference is now made to FIGS. 8D and 8E. In FIGS. 8D and 8E, the fifth elongated semiconductor feature 718-5 and sixth elongated semiconductor feature 718-6 in FIG. 8C are completely removed by the etch process. However, at this point, observable dimensional reduction to the upper elongated semiconductor features 720 may be resulted. As shown in FIG. 8D, the elongated semiconductor feature 720-2, the elongated semiconductor feature 720-3, elongated semiconductor feature 720-5, and the elongated semiconductor feature 720-6 have reduced widths (along the X direction) and reduced thickness (along the Z direction) when compared to the other underlying elongated semiconductor features, such as the elongated semiconductor features 720-4 and 720-7. In both FIGS. 8D and 8E, the topmost elongated semiconductor features (720-2 in FIG. 8D and 720-5 in FIG. 8E) have the smallest width (along the X direction) and the smallest thickness (along the Z direction) along all the elongated semiconductor features in the same active region.

Figure 9:
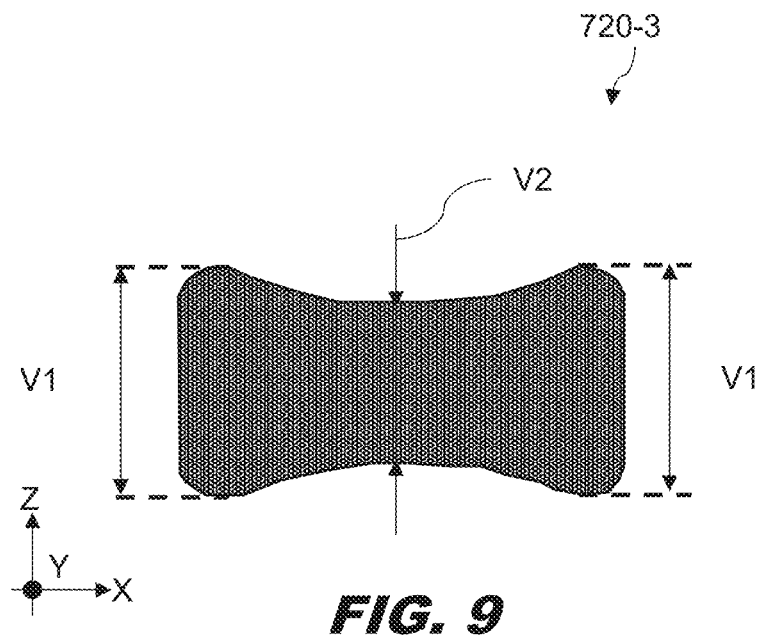
FIG. 9 is a schematic diagram showing a cross-section of a nanostructure in a stacked nanowire transistor, according to one example of principles described herein.
Figure 10:
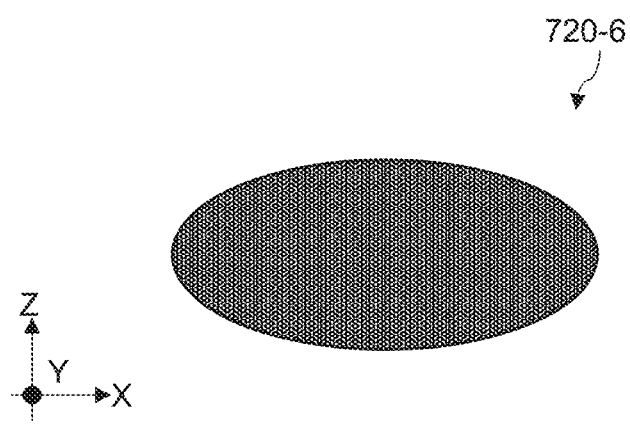
FIG. 10 is a schematic diagram showing a cross-section of another nanostructure in a stacked nanowire transistor, according to one example of principles described herein.

Depending on the extent of germanium diffusion from the elongated semiconductor features 718 into the elongated semiconductor features 720, the upper two elongated semiconductor features 720-2 and 720-3 in FIG. 8D may be different from the elongated semiconductor features 720-5 and 720-6 in FIG. 8E. A cross-sectional view of the elongated semiconductor feature 720-3 is enlarged and shown in FIG. 9. A cross-sectional view of the elongated semiconductor feature 720-6 is enlarged and shown in FIG. 10. In some embodiments illustrated in FIG. 9, the elongated semiconductor feature 720-3 may have a dog-bone shape when viewed along the Y direction. The dog-bone shape includes two end portions each having a first vertical dimension V1 and a center portion having a second vertical dimension V2. The second vertical dimension V2 is smaller than the first vertical dimension V1, hence the dog-bone shape. In some embodiments illustrated in FIG. 10, the elongated semiconductor feature 720-6 may have an oval/ellipse shape when viewed along the Y direction. The interplay of etching and germanium diffusion may explain the difference between the dog bone shape and the oval shape. When germanium diffuses from the elongated semiconductor feature 718 into the elongated semiconductor feature 720, germanium diffusion is the dominant factor and the center portion of the elongated semiconductor feature 720 may etch faster, resulting in the dog bone shape shown in FIG. 9. When little germanium diffuses from the elongated semiconductor feature 718 into the elongated semiconductor feature 720, etching is the dominant factor and over-etching from the edge may result in the oval shape shown in FIG. 10. While not shown in FIGS. 8D and 8E, elongated semiconductor features of a dog-bone shape and an oval shape may be present in the same active region after elongated semiconductor features are fully released.

Using principles described herein, various types of stacked nanowire transistors may be formed using an efficient process flow. Specifically, such stacked nanowire transistors may have varying characteristics suited for different transistor functions such as input/output, storage, and core transistors. The different types of stacked nanowire transistors can be formed using the processes described above to have varying characteristics of the stacked nanowires (elongated semiconductor structures). Additionally, despite having various nanowire characteristics, the top-most nanowires from each of the varying stacked nanowire transistors may be substantially coplanar.

According to one example, a method includes forming a first semiconductor stack using an epitaxial growth process, the first semiconductor stack comprising a first plurality of semiconductor layers alternating with a second plurality of semiconductor layers, the first plurality of semiconductor layers comprising a first semiconductor material and the second plurality of semiconductor layers comprising a second semiconductor material that is different than the first semiconductor material. The method further includes patterning the first semiconductor stack to form a set of semiconductor stack features, forming isolation features between the semiconductor stack features, removing at least one of the semiconductor stack features, thereby forming at least one trench, and forming, within the trench, a second semiconductor stack using an epitaxial growth process, the second semiconductor stack having different characteristics than the first semiconductor stack.

According to one example, a method including forming, on a substrate, a first semiconductor stack, the first semiconductor stack comprising a first plurality of semiconductor layers alternating with a second plurality of semiconductor layers, the first plurality of semiconductor layers comprising a first semiconductor material and the second plurality of semiconductor layers comprising a second semiconductor material that is different than the first semiconductor material. The method further includes removing a first portion of the first semiconductor stack over a first region of the substrate while leaving a second portion of the first semiconductor stack over a second region of the substrate, forming, on the first region of the substrate, a second semiconductor stack, the second semiconductor stack having different characteristics than the first semiconductor stack, and patterning the first semiconductor stack and the second semiconductor stack to form a first set of semiconductor stack features over the first region and a second set of semiconductor stack features over the second region.

According to one example, a semiconductor device includes a first stacked elongated semiconductor feature transistor having a first set of elongated semiconductor features isolated from each other and arranged along a line in a direction perpendicular to the substrate, the first set of elongated features comprising a first set of characteristics. The semiconductor device further includes a second stacked elongated semiconductor feature transistor having a second set of elongated semiconductor features isolated from each other and arranged along a line in a direction perpendicular to the substrate, the second set of elongated features comprising a second set of characteristics that is different than the first set of characteristics.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first transistor comprising a fin-like semiconductor body extending continuously from a top surface of a silicon substrate; and
a second transistor comprising a first vertical stack of elongated semiconductor features over the silicon substrate,
wherein a height of the fin-like semiconductor body is greater than a height of the first vertical stack of elongated semiconductor features,
wherein the fin-like semiconductor body comprises a uniform composition along the height of the fin-like semiconductor body,
wherein each of the first vertical stack of elongated semiconductor features extends lengthwise along a direction,
wherein at least one of the first vertical stack of elongated semiconductor features includes a dog-bone shape cross-section when viewed along the direction,
wherein a topmost elongated semiconductor feature of the first vertical stack of elongated semiconductor features has a first thickness,
wherein a bottommost elongated semiconductor feature of the first vertical stack of elongated semiconductor features has a second thickness greater than the first thickness.

2. The semiconductor device of claim 1,
wherein the first transistor is disposed over an input/output (I/O) region of the semiconductor device,
wherein the second transistor is disposed over a core region of the semiconductor device.

3. The semiconductor device of claim 1,
wherein the first transistor is disposed over a high-voltage application region of the silicon substrate,
wherein the second transistor is disposed over a core region of the silicon substrate.

4. The semiconductor device of claim 1, further comprising:
a third transistor comprising a second vertical stack of elongated semiconductor features over the silicon substrate,
wherein a width of each of the second vertical stack of elongated semiconductor features is greater than a width of each of the first vertical stack of elongated semiconductor features.

5. The semiconductor device of claim 4, wherein a height of the fin-like semiconductor body is greater than a height of the second vertical stack of elongated semiconductor features.

6. The semiconductor device of claim 1, further comprising:
a third transistor comprising a third vertical stack of elongated semiconductor features over the silicon substrate; and
a fourth transistor comprising a fourth vertical stack of elongated semiconductor features over the silicon substrate,
wherein a thickness of each of the third vertical stack of elongated semiconductor features is greater than a thickness of each of the fourth vertical stack of elongated semiconductor features.

7. The semiconductor device of claim 6, wherein a height of the fin-like semiconductor body is greater than a height of the third vertical stack of elongated semiconductor features.

8. The semiconductor device of claim 1, wherein the fin-like semiconductor body comprises germanium and the first transistor is a p-type fully strained channel transistor.

9. A semiconductor device comprising:
a first transistor comprising a first vertical stack of elongated semiconductor features over a substrate, the first vertical stack of elongated semiconductor features extending along a direction,
wherein at least one of the first vertical stack of elongated semiconductor features includes a dog-bone shape cross-section when viewed along the direction,
wherein a width of a topmost elongated semiconductor feature of the first vertical stack of elongated semiconductor features is smaller than a width of another elongated semiconductor feature of the first vertical stack of elongated semiconductor features.

10. The semiconductor device of claim 9, wherein at least one of the first vertical stack of elongated semiconductor features includes a rectangular cross-section when viewed along the direction.

11. The semiconductor device of claim 9, further comprising a second transistor comprising a fin-like semiconductor body over the substrate.

12. The semiconductor device of claim 11,
wherein the first transistor is disposed over a core region of the semiconductor device,
wherein the second transistor is disposed over a high-voltage region of the semiconductor device.

13. The semiconductor device of claim 11,
wherein the first transistor is disposed over a core region of the substrate,
wherein the second transistor is disposed over an input/out (I/O) region of the substrate.

14. The semiconductor device of claim 11, further comprising:
a third transistor comprising a second vertical stack of elongated semiconductor features over the substrate,
wherein a width of each of the second vertical stack of elongated semiconductor features is greater than a width of each of the first vertical stack of elongated semiconductor features.

15. The semiconductor device of claim 11, wherein a height of the fin-like semiconductor body is greater than a height of the first vertical stack of elongated semiconductor features.

16. The semiconductor device of claim 11, wherein the fin-like semiconductor body comprises germanium and the second transistor is a p-type fully strained channel transistor.

17. A semiconductor device comprising:
a fin-type transistor comprising a fin-like semiconductor body extending continuously from a top surface of a substrate; and
a gate-all-around (GAA) transistor comprising a first vertical stack of elongated semiconductor features over the substrate,
wherein a height of the fin-like semiconductor body is greater than a height of the first vertical stack of elongated semiconductor features,
wherein a width of each of the first vertical stack of elongated semiconductor features is greater than a width of the fin-like semiconductor body,
wherein the fin-like semiconductor body comprises a uniform composition along the height of the fin-like semiconductor body, wherein a topmost elongated semiconductor feature of the first vertical stack of elongated semiconductor features has a first width, wherein a bottommost elongated semiconductor feature of the first vertical stack of elongated semiconductor features has a second width greater than the first width, wherein the first vertical stack of elongated semiconductor features extends lengthwise along a direction, wherein at least one of the first vertical stack of elongated semiconductor features includes dog-bone shape cross-section when viewed along the direction.

18. The semiconductor device of claim 17, wherein the fin-type transistor is disposed over an input/output (I/O) region of the substrate, wherein the GAA transistor is disposed over a core region of the substrate.

19. The semiconductor device of claim 17, wherein a width of a topmost elongated semiconductor feature of the first vertical stack of elongated semiconductor features is smaller than a width of another elongated semiconductor feature of the first vertical stack of elongated semiconductor features.

20. The semiconductor device of claim 17, wherein the topmost elongated semiconductor feature of the first vertical stack of elongated semiconductor features has a first thickness along a vertical direction, wherein the bottommost elongated semiconductor feature of the first vertical stack of elongated semiconductor features has a second thickness along the vertical direction, wherein the second thickness is greater than the first thickness.

\* \* \* \* \*